United States Patent
Futatsuyama et al.

(10) Patent No.: US 8,472,259 B2
(45) Date of Patent: Jun. 25, 2013

(54) NON-VOLATILE SEMICONDUCTOR MEMORY DEVICE

(75) Inventors: Takuya Futatsuyama, Yokohama (JP); Mitsuaki Honma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 13/175,176

(22) Filed: Jul. 1, 2011

(65) Prior Publication Data

US 2012/0002470 A1 Jan. 5, 2012

(30) Foreign Application Priority Data

Jul. 5, 2010 (JP) .................................. 2010-152655

(51) Int. Cl.
*G11C 16/06* (2006.01)
(52) U.S. Cl.
USPC ............... 365/185.22; 365/185.2; 365/185.29
(58) Field of Classification Search
USPC ............... 365/185.2, 185.22, 185.29, 185.03, 365/185.17, 185.33
See application file for complete search history.

(56) References Cited

U.S. PATENT DOCUMENTS

| | | | | |
|---|---|---|---|---|
| 5,691,941 A | * | 11/1997 | Imamiya et al. | 365/185.3 |
| 5,708,602 A | * | 1/1998 | Yamada | 365/185.2 |
| 6,643,188 B2 | | 11/2003 | Tanaka et al. | |
| 7,764,542 B2 | | 7/2010 | Edahiro et al. | |
| 7,808,821 B2 | | 10/2010 | Ogawa et al. | |
| 2010/0124109 A1 | | 5/2010 | Honma et al. | |

OTHER PUBLICATIONS

U.S. Appl. No. 13/038,928, filed Mar. 2, 2011, Yuko Namiki, et al.

* cited by examiner

*Primary Examiner* — Gene Auduong
(74) *Attorney, Agent, or Firm* — Oblon, Spivak, McClelland, Maier & Neustadt, L.L.P.

(57) ABSTRACT

A non-volatile semiconductor memory device according to an embodiment includes a data write portion, the data write portion includes, in a write loop, a first operation mode of sequentially performing a program operation and a first verify operation, and a second operation mode of sequentially performing the program operation, the first verify operation, and a second verify operation, and the data write portion includes, in the first verify operation, precharging a bit-line connected to the first memory cell and a bit-line connected to a second memory cell adjacent to the first memory cell and verifying data of the first memory cell, then in the second verify operation, when the write to the second memory cell is completed, without precharging the bit-line connected to the second memory cell, precharging the bit-line connected to the first memory cell and verifying data of the first memory cell.

20 Claims, 18 Drawing Sheets

S101: DATA ERASE

S102: L PAGE WRITE

S103: U PAGE WRITE

US 8,472,259 B2

NON-VOLATILE SEMICONDUCTOR MEMORY DEVICE

CROSS-REFERENCE TO RELATED APPLICATIONS

This application is based upon and claims the benefit of priority from the prior Japanese Patent Application No. 2010-152655, filed on Jul. 5, 2010, the entire contents of which are incorporated herein by reference.

FIELD

The embodiments of the present invention relate to a non-volatile semiconductor memory device.

BACKGROUND

A known electrically rewritable and highly integratable non-volatile semiconductor memory device is a NAND flash memory. The NAND flash memory includes a NAND string in which a plurality of memory cells are connected in series and the adjacent memory cells share a source/drain diffusion layer. The NAND string has ends connected to a bit-line and a source-line, respectively, via a select gate transistor. Such a NAND string configuration allows for a smaller unit cell area and a larger capacity than a NOR flash memory.

The memory cell in the NAND flash memory includes a semiconductor substrate and a tunnel insulating film, a charge accumulation layer (floating gate), an inter-gate dielectric film, and a control gate, which are stacked in this order on the substrate. The memory cell stores data in a non-volatile manner according to the charge accumulation state of the floating gate. The memory cell stores binary data using, for example, data "0" representing the higher threshold voltage state in which the floating gate is injected with electrons and data "1" representing the lower threshold voltage state in which electrons in the floating gate are discharged. The threshold voltage distribution to be written may be further divided to provide a multi-level storage such as four-level or eight-level storage.

The write of data to the NAND flash memory usually includes a program operation of accumulating charges in the charge accumulation layer to record data and a verify operation of verifying whether desired data is recorded by the program operation.

As the NAND flash memory has recently become smaller, a coupling noise between the adjacent memory cells tends to make it difficult to have a normal verify or an accurate program, thereby broadening the threshold voltage distribution. The same holds true for the charge-trap type non-volatile memory in which the charge accumulation layer includes an insulating film such as an MONOS film.

DETAILED DESCRIPTION

A non-volatile semiconductor memory device according to an embodiment includes: a memory cell array including a plurality of bit-lines, a plurality of word-lines intersecting the bit-lines, a source-line, and a plurality of NAND strings, each NAND string including a plurality of memory cells connected in series, each memory cell including a control gate connected to one of the word-lines, each NAND string including ends connected to the source-line and one of the bit-lines, respectively; and a data write portion configured to repeat a write loop of writing data in units of a page including a plurality of memory cells connected to one word-line, the data write portion including, in the write loop, a first operation mode of sequentially performing a program operation of recording data to a memory cell and a first verify operation of verifying data record in the memory cell, and a second operation mode of sequentially performing the program operation, the first verify operation, and a second verify operation of verifying data record in the memory cell, the data write portion including, in the first verify operation, precharging a bit-line connected to a predetermined first memory cell of the memory cells and a bit-line connected to a second memory cell in the same page as the first memory cell, the second memory cell being adjacent to the first memory cell, and sensing a current through the bit-line connected to the first memory cell to verify data of the first memory cell, then in the second verify operation, when the write to the second memory cell is completed, without precharging the bit-line connected to the second memory cell, precharging the bit-line connected to the first memory cell, and sensing a current through the bit-line connected to the first memory cell to verify data of the first memory cell.

With reference to the drawings, a non-volatile semiconductor memory device according to embodiments will be described below.

First Embodiment

Entire Configuration

First, the entire configuration of a non-volatile semiconductor memory device according to a first embodiment will be described.

Figure 1:
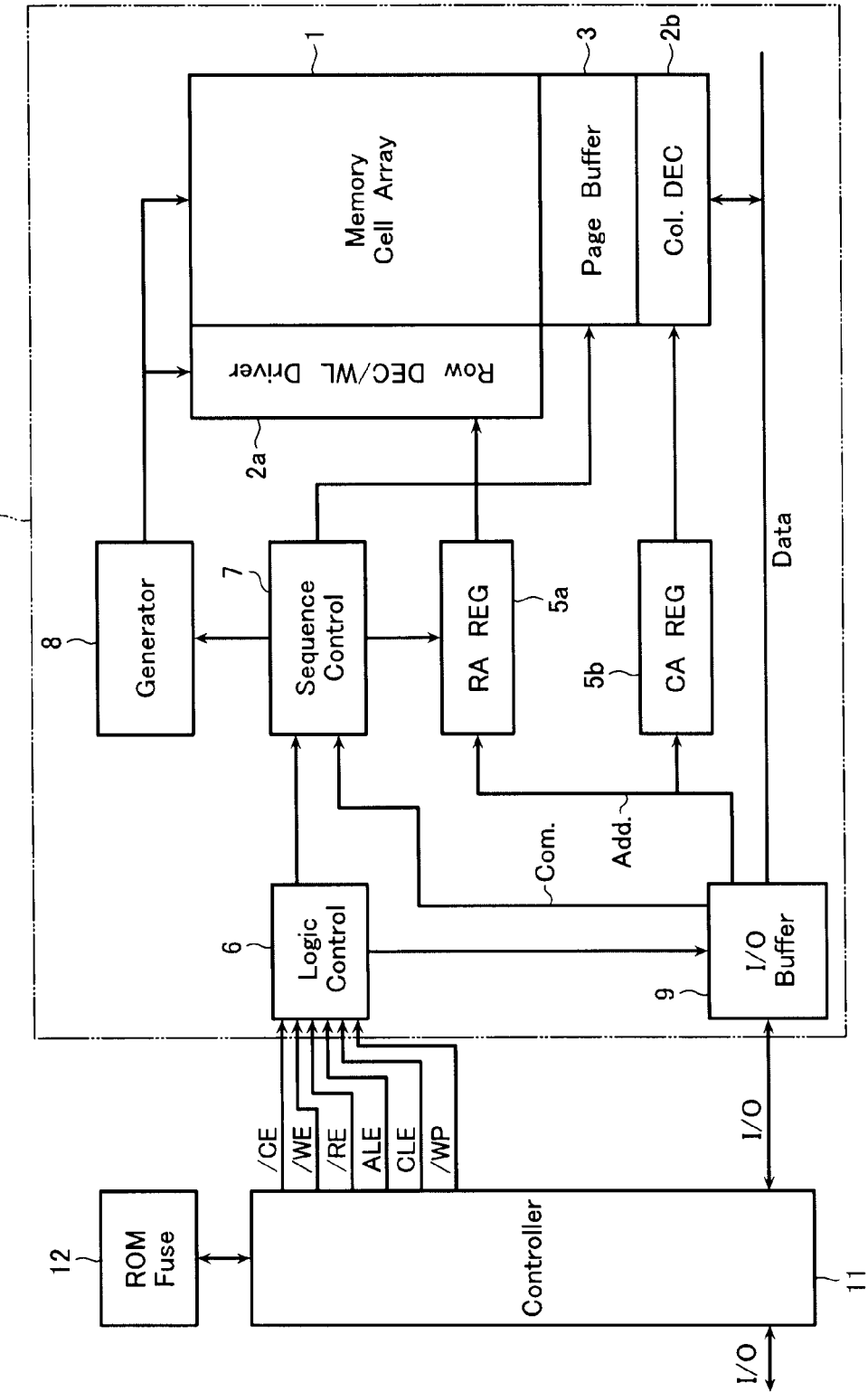
FIG. 1 is a block diagram of a non-volatile semiconductor memory device according to a first embodiment.

FIG. 1 is a block diagram of the non-volatile semiconductor memory device according to this embodiment.

The NAND flash memory includes a NAND chip 10, a controller 11 for controlling the NAND chip 10, and a ROM fuse 12 for storing various information necessary for the write operation.

The NAND chip 10 includes a memory cell array 1. The memory cell array 1 includes a plurality of floating-gate memory cells MC arranged in a matrix as described below. A row decoder/word-line driver 2a, a column decoder 2b, a page buffer 3, and a voltage generation circuit 8 together form a data write portion for writing and reading data from the memory cell array 1 in units of pages. The row decoder/word-line driver 2a drives a word-line and a select gate line in the memory cell array 1. The page buffer 3 includes a sense amplifier circuit and a data holding circuit for one-page data. The buffer 3 reads and writes data from the memory cell array 1 in units of pages.

One-page read data of the page buffer 3 is sequentially column selected by the column decoder 2b. The data is then output to an external I/O terminal via an I/O buffer 9. Write data from the I/O terminal is selected by the column decoder 2b and is loaded into the page buffer 3. The page buffer 3 is loaded with one-page write data. Row and column address signals are input via the I/O buffer 9. The signals are then transferred to the respective row decoder 2a and column decoder 2b. A row address register 5a holds, in the erase operation, an erase block address and holds, in the write or read operation, a page address. A column address register 5b receives a start column address for loading write data before starting the write operation or a start column address for the read operation. Until a write enable/WE or a read enable/RE is toggled in a predetermined condition, the column address register 5b holds the received column address.

A logic control circuit 6 controls a command or address input and a data input/output according to a chip enable signal/CE, a command enable signal CLE, an address latch enable signal ALE, a write enable signal/WE, a read enable signal/RE, and other control signals. The read operation or the write operation is performed by a command. In response to the command, the sequence control circuit 7 performs the sequence control of the read, write, or erase operation. The voltage generation circuit 8 is controlled by the control circuit 7 to generate predetermined voltages necessary for various operations.

The controller 11 controls the data write and read under the condition adequate for the present write state of the NAND chip 10. It should be appreciated that a portion of the read control as described below may be performed by the NAND chip 10.

<Memory Cell Array>

A description is now given of the memory cell array 1 in the non-volatile semiconductor memory device according to this embodiment.

Figure 2:
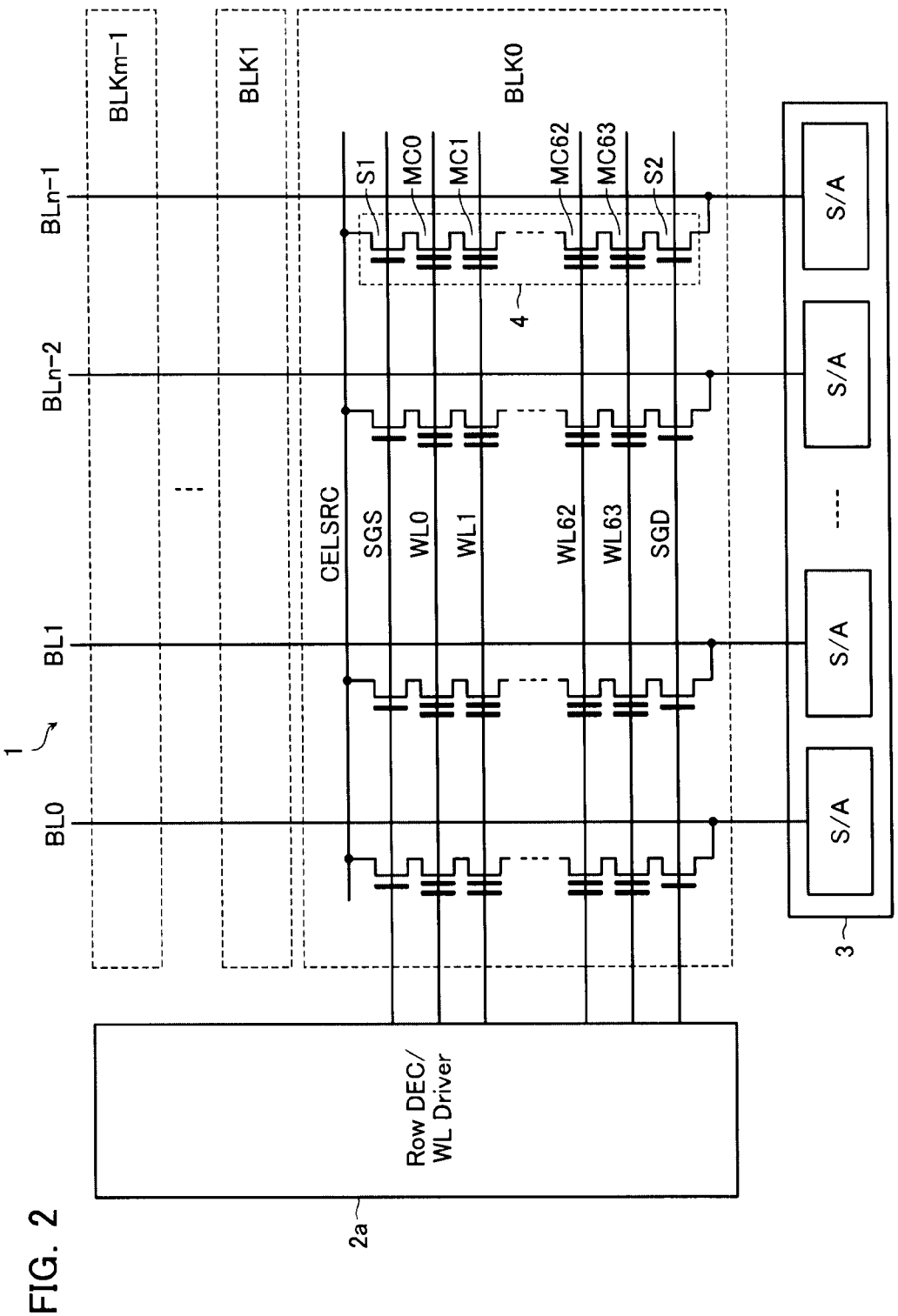
FIG. 2 is a circuit diagram of a memory cell array of the non-volatile semiconductor memory device according to this embodiment.

FIG. 2 is a circuit diagram of the memory cell array 1. With reference to FIG. 2, a NAND string 4 includes 64 memory cells MC0 to MC63 connected in series and select gate transistors S1 and S2 connected to the respective ends of the NAND string 4. The select gate transistor S1 has a source connected to a common source-line CELSRC. The select gate transistor S2 has a drain connected to a bit-line BL (BL0 to BLn−1). The memory cells MC0 to MC63 have their control gates connected to the respective word-lines WL (WL0 to WL63). The select gate transistors S1 and S2 have their gates connected to the respective select gate line SGS and SGD.

The area including the memory cells MC along one word-line WL provides a page as the unit for collectively reading or writing data. The area including more than one NAND strings 4 arranged in the word-line WL direction provides a block BLK as the unit for collectively erasing data. With reference to FIG. 2, each bit-line BL is shared by a plurality of blocks BLK0 to BLKm−1 arranged in the bit-line BL direction. The cell blocks BLK0 to BLKm−1 together form the cell array 1. The word-lines WL and the select gate lines SGS and SGD are driven by the row decoder 2a. The bit-lines BL are connected to the respective sense amplifier circuits S/A of the page buffer 3.

A description is given here of a "page" as the access unit to the NAND flash memory. Note that in the following discussion, a "page" has different two meanings.

The first meaning is a "page" as the collective data access unit along one word-line. This embodiment uses the ABL scheme of the collective access to all memory cells connected to one word-line.

The second meaning is a "page" showing the hierarchy of stored data when storing multi-bit in one memory cell. The page is here referred to as a lower (L) page, a middle (M) page, an upper (U) page or the like.

<Write Operation>

A description is now given of the write operation to the non-volatile semiconductor memory device according to this embodiment.

Figure 3:
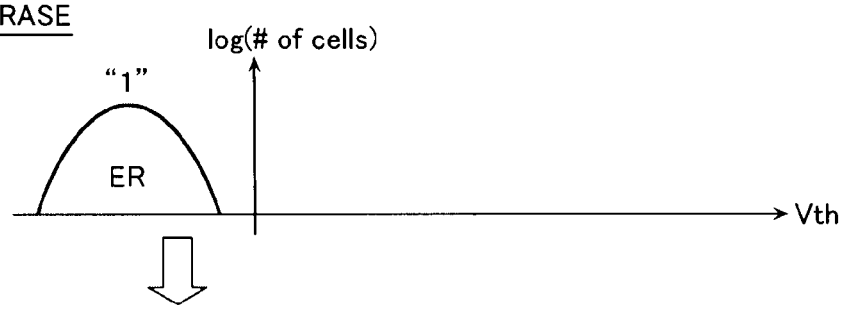
FIG. 3 shows changes of the threshold voltage distribution of the memory cell in the write for storing 2-bit per cell in the non-volatile semiconductor memory device according to this embodiment.
Figure 3:
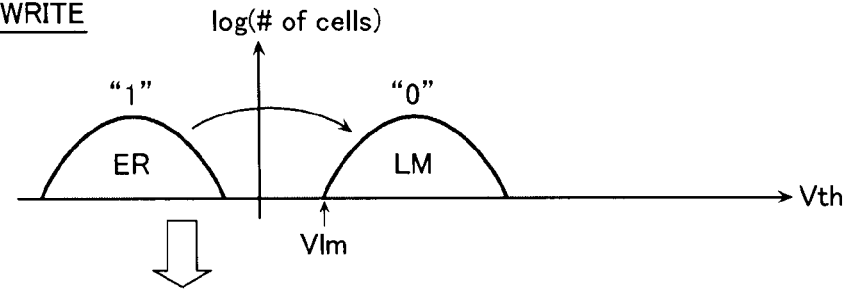
Figure 3:
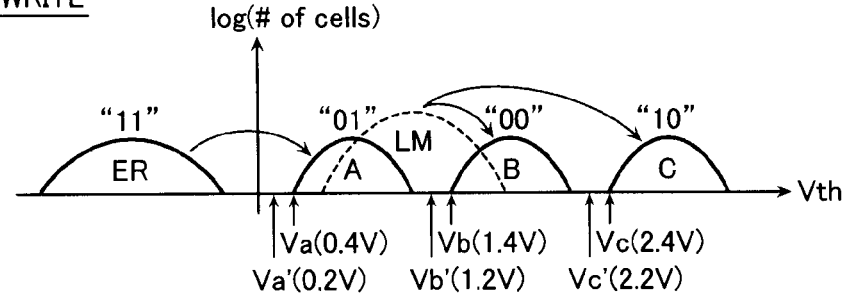

FIG. 3 shows changes of the threshold voltage distribution of the memory cell in the write operation for storing 2-bit per cell.

First, in step S101, data is collectively erased over the whole block. The threshold voltages of all memory cells MC in the block thus change to the lowest ER level.

Then, in step S102, the L page write is performed according to the lower bit of the write data. For the lower bit of "1," the threshold voltages of the memory cells remain at the ER level. For the lower bit of "0," the threshold voltages of the memory cells change from the ER level to the LM level that is between the A level and the B level and is higher than the voltage Vlm.

Finally, in step S103, the U page write is performed according to the upper bit of the write data. If the threshold voltage of the memory cell is at the ER level, then, for the upper data of "1," the threshold voltage of the memory cell remains at the ER level. Conversely, for the upper bit of "0," the threshold voltage of the memory cell changes to the A level higher than the voltage Va (Va<Vlm). If the threshold voltage of the memory cell is the LM level, then, for the upper bit of "0," the threshold voltage of the memory cell changes to the B level higher than the voltage Vb (Va<Vb). Conversely, for the upper data of "1," the threshold voltage of the memory cell changes to the C level higher than the voltage Vc (Vb<Vc).

As described above, two-bit data is written to the memory cell by the two write steps of the L page write and the U page write. Each write step repeats a plurality of write loops. Each write loop includes a program operation of recording data in the memory cell and a verify operation of verifying data record in the memory cell.

Before describing the write loop according to this embodiment, to assist in understanding it, a comparative example and its problems will be described below. Hereinafter, a predetermined memory cell in a page to which data is written is referred to as a "focused cell," and a memory cell that is in the same page as the focused cell and is adjacent to the focused cell is referred to as an "adjacent cell."

Figure 18:
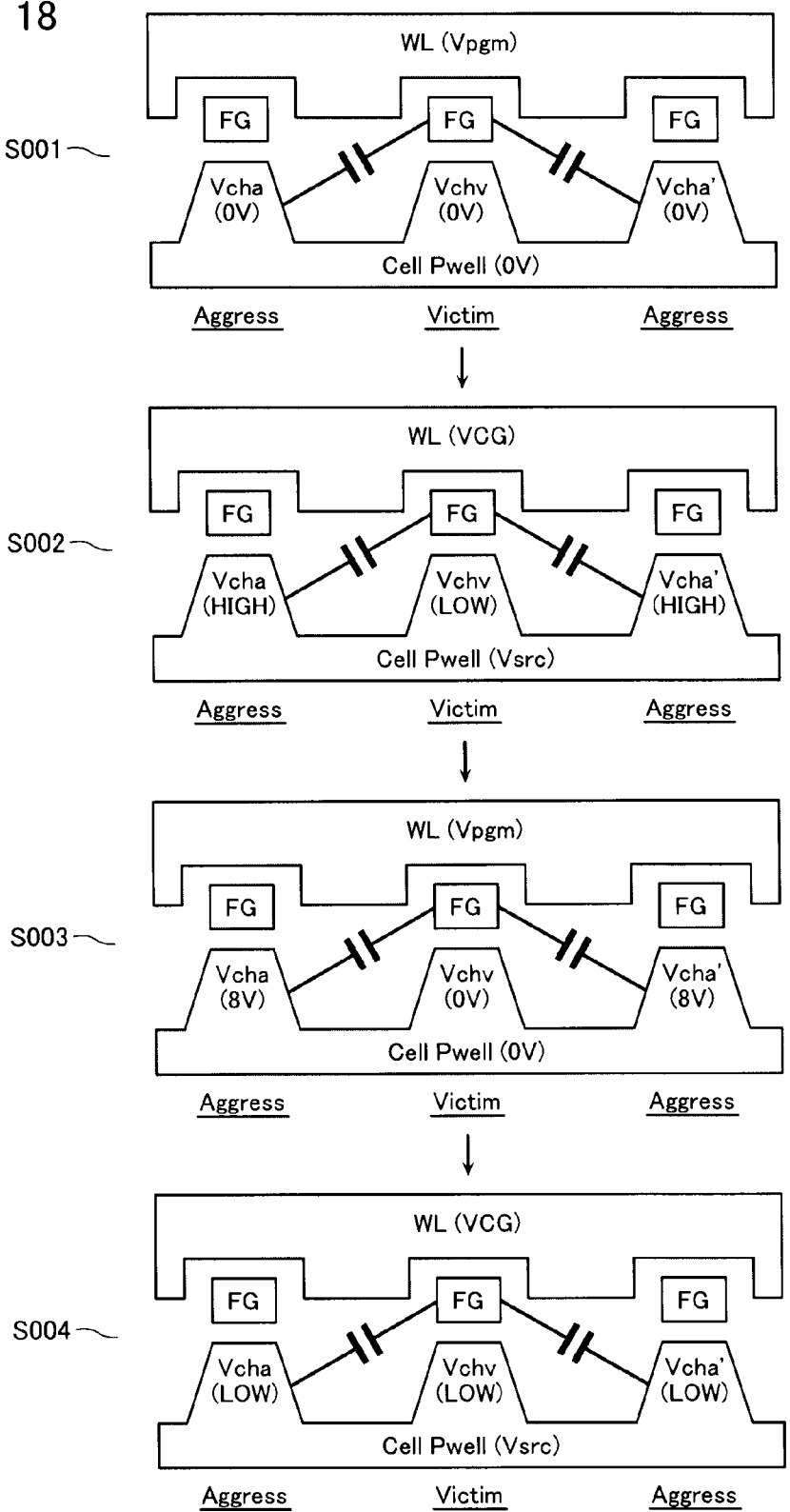
FIG. 18 shows the voltage application relationship between memory cells in the write operation in a non-volatile semiconductor memory device according to a comparative example.

FIG. 18 illustrates the voltage application relationship of the memory cells in the write operation in a semiconductor memory device according to the comparative example. FIG. 18 is a cross-sectional view of the memory cell along the word-line WL. It is assumed that the data write has been completed until a predetermined (k−1)th write loop and the focused cell ("Victim" in FIG. 18) and the adjacent cells ("Aggress" in FIG. 18) have not been written with data.

First, the flow shown in FIG. 18 will be briefly described.

First, in step S001, the program operation of the k-th write loop is performed. It is assumed that the data write to the two adjacent cells is thus completed. It is also assumed that the data write to the focused cell is not completed, but is almost completed.

Then, in step S002, the verify operation of the k-th write loop is performed. This verify operation is performed after the bit-line BL is previously precharged. The two adjacent cells in which the data write is completed then pass the verify. The focused cell in which the data write is not completed does not pass the verify.

Then, in step S003, the program operation of the (k+1)th write loop is performed. The program is here inhibited to the two adjacent cells that have passed the verify in step S002.

Then, in step S004, the verify operation of the (k+1)th write loop is performed. Here, to reduce the current consumption by the verify operation, the bit-lines BL connected to the two adjacent cells that have already passed the verify in step S002 are not precharged (hereinafter, this operation is referred to as a "precharge select").

The above write operation may have the following two problems.

The first problem is that in the write operation, the coupling noise between the floating gate of the focused cell and the channel regions of the adjacent cells may induce write acceleration.

The write acceleration is particularly significant when in a certain write loop, the write to the focused cell is almost completed and the write to one or both of the adjacent cells is completed.

Compare now step S001 with step S003 in FIG. 18. In step S001, the channel voltage Vchv of the focused cell and the channel potentials Vcha and Vcha' of the adjacent cells are at a low voltage of, for example, about 0V. In step S003, the adjacent cells are in the program inhibited state. Their channel voltages Vcha and Vcha' are thus at a high voltage of, for example, about 8V, and the channel voltage Vchv of the focused cell is at a low voltage of, for example, 0V. In this way, step S003 provides higher channel voltages Vcha and Vcha' of the adjacent cells than step S001.

As NAND flash memories have recently become smaller to provide a large capacity at low cost, the word-line width, the adjacent word-line space, the bit-line width, and the adjacent bit-line space are all decreased. To maintain the reliability of the memory cell characteristics, however, the reduction of the thickness of the gate-insulating film is difficult to perform. The ratio of the gate capacitance (the capacitance with the floating gate and channel region) to the total capacitance from the floating gate has thus become very low. The voltage of the floating gate in the floating state thus tends to be largely changed by varying voltages of each node of the adjacent cells.

In step S003, the channel voltages Vcha and Vcha' of the adjacent cells are higher than those in step S001. This increases the voltage of the floating gate FG of the focused cell in the program operation and thus accelerates the write to the focused cell. As a result, the threshold voltage of the focused cell increases higher than assumed, thereby broadening the threshold voltage distribution of the focused cell.

The second problem is that in the verify operation, the coupling noise between the floating gate of the focused cell and the channel regions of the adjacent cells may induce a cell to cell interference.

The cell to cell interference is particularly significant when in a certain write loop, the write to the focused cell is almost completed and the write to one or both of the adjacent cells is completed.

Compare now step S002 with step S004 in FIG. 18. In step S002, the adjacent cells conduct little current in the verify operation because the write to the adjacent cells have been completed in step S001. The drain voltages and channel voltages Vcha and Vcha' of the adjacent cells are thus a high voltage near the precharge voltage of the bit-line BL. Because the write to the focused cell has not been completed, the drain voltage and channel voltage Vchv of the focused cell are a low voltage near the voltage Vsrc of the cell source and P well.

In step S004, because the write to the adjacent cells have been completed in step S003, the precharge select applies the bit-lines BL of the adjacent cells with the voltage Vsrc of the cell source and P well. The drain voltages and channel voltages Vcha and Vcha' of the adjacent cells thus change to a low voltage near the voltage Vsrc. Because the write to the focused cell has not been completed, the drain voltage and channel voltage Vchv of the focused cell change to, like step S001, a low voltage near the voltage Vsrc of the cell source and P well. As a result, at least the drain voltage (and possibly the channel voltages Vcha and Vcha' depending on the threshold voltage of the adjacent cells) of the adjacent cells in step S004 becomes lower than that in step S002. The coupling noise between the drains of the adjacent cells and the floating gate of the focused cell thus decreases the voltage of the floating gate of the focused cell. As a result, the threshold voltage of the focused cell becomes substantially high and thus it appears that the write proceeds.

Because of the first problem, in the program operation, the focused cell experiences the cell to cell interference from the adjacent cells. Moreover, if the precharge select is performed, because of the second problem, the focused cell in the verify operation experiences the cell to cell interference from the adjacent cells, thereby causing the threshold voltage to appear higher. This broadens the threshold voltage distribution of the memory cell.

Figure 4:
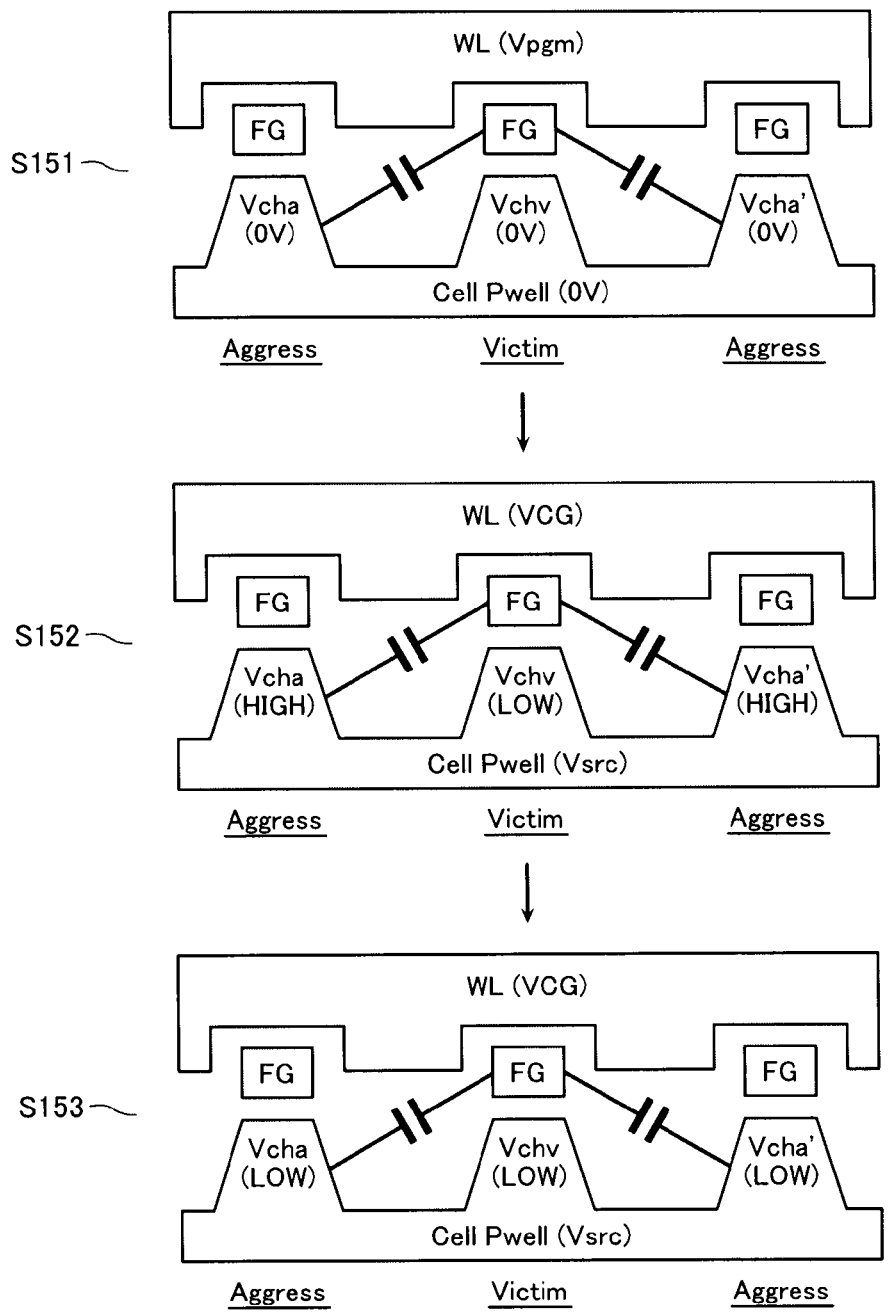
FIG. 4 shows the voltage application relationship of the memory cells in the write operation of the non-volatile semiconductor memory device according to this embodiment.

In this embodiment, therefore, some of the write loops include two verify operations. FIG. 4 illustrates the voltage application relationship of the memory cells in the verify operations.

FIG. 4 shows a write loop that includes three steps S151, S152, and S153 corresponding to the respective steps S001, S002, and S003 in FIG. 18.

In other words, in the program operation in step S151, the word-line WL is applied with the programming voltage Vpgm, and the channel voltage Vchv of the focused cell and the channel voltages Vcha and Vcha' of the adjacent cells are, for example, a low voltage of 0V. Note that when the write speed adjustment function described in the fifth embodiment is used, the channel voltage Vchv of the focused cell may be about 1V.

Then, in step S152, in the first time verify operation (the first verify operation), the word-line WL is applied with the verify voltage. In this case, because the adjacent cells being written with data conducts little current, the channel voltages Vcha and Vcha' of the adjacent cells are a high voltage near the precharge voltage of the bit-line BL. The drain voltage and channel voltage Vchv of the focused cell in which the data write is almost completed are a low voltage near the voltage Vsrc of the cell source and P well. Note that the voltage Vsrc is 0V, 1V, or the like depending on the operation scheme.

Finally, in step S153, in the second time verify operation (the second verify operation), the precharge select is set to the adjacent cells and then the focused cell is verified. As a result, the drain voltages and channel voltages Vcha and Vcha' of the adjacent cells decrease and thus the threshold voltage of the focused cell appears higher than the first verify operation.

In such a write loop, when the write to the focused cell is almost completed, even if the focused cell does not pass the verify in the first verify operation, it may pass the verify in the second verify operation. As a result, in the program operation of the subsequent write loops, the program to the focused cell may be inhibited. Therefore, the first problem of the accelerated write to the focused cell may be avoided and thus the threshold voltage distribution of the focused cell may be narrowed.

Note that because two verify operations in all write loops will delay the write process, it is desired to perform them in some of the write loops. Specifically, the two verify operations are performed around the write loop in which the number of memory cells in which the data write is completed reaches the peak.

Note that in FIG. 5 to FIG. 9 and FIG. 12 to FIG. 17, the write loop performed in the first operation mode including the program operation followed by only one verify operation is expressed as "p_v1," and the write loop performed in the second operation mode including the program operation followed by two verify operations is expressed as "p_v12."

A description is now given of the relationship between the number of memory cells in which the write is completed and the write loop.

Figure 5:
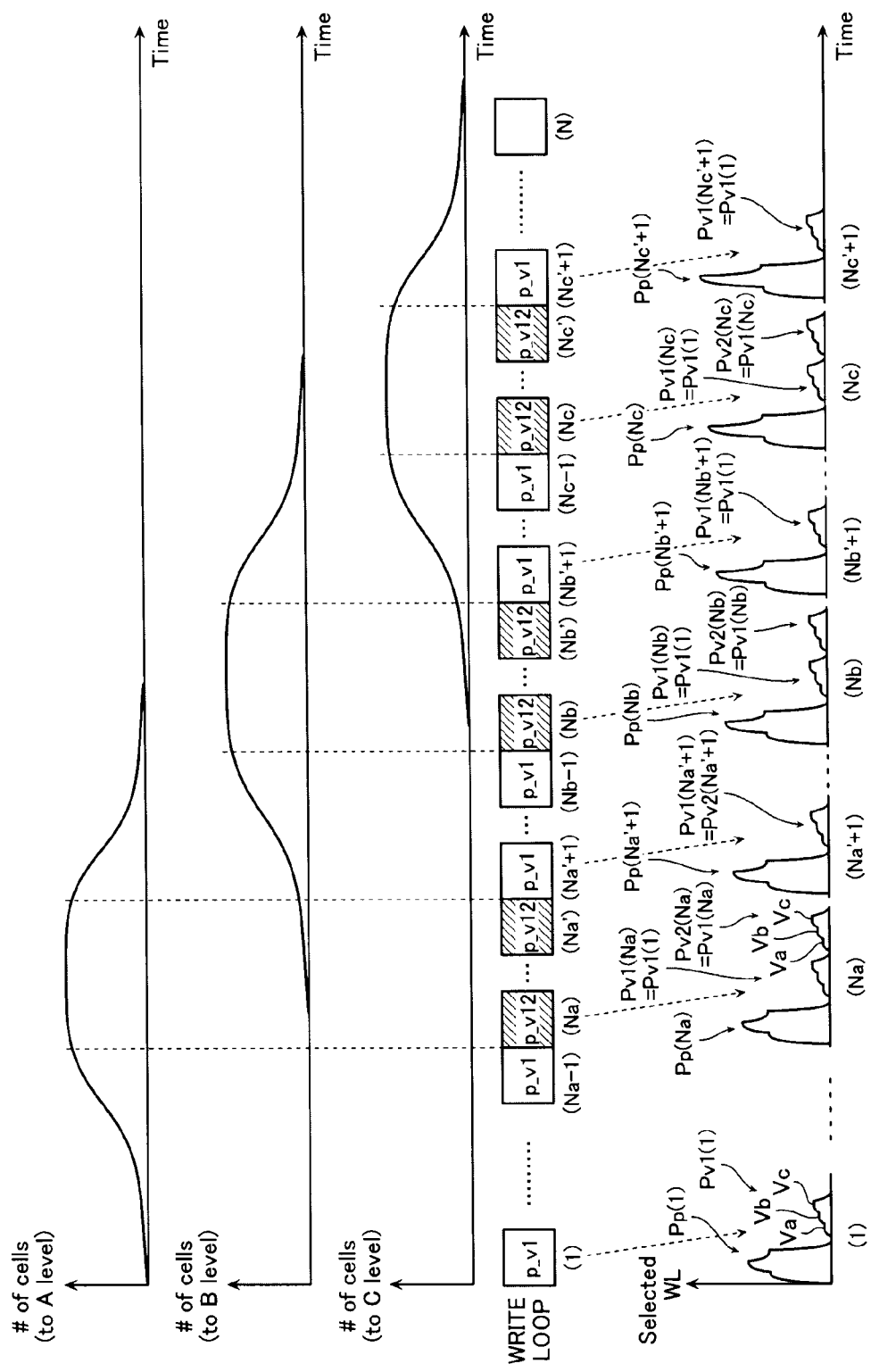
FIG. 5 shows the relationship between the number of memory cells in which the write is completed, the write loop, and the word-line voltage in the non-volatile semiconductor memory device according to this embodiment.

FIG. 5 shows an example of the non-volatile semiconductor memory device using a memory cell for storing 2-bit per cell. It is assumed that one-page data write is completed in the N write loops and many of the memory cells MC(A) to be changed to the A level change to the A level in the Na-th to Na'-th write loops. Similarly, many of the memory cells MC(B) to be changed to the B level change to the B level in the Nb-th to Nb'-th write loops, and many of the memory cells MC(C) to be changed to the C level change to the C level in the Nc-th to Nc'-th write loops. Note that the number of write loops has a relationship of 1<Na<Na'<Nb<Nb'<Nc<Nc'<N.

First, in the 1st to (Na−1)th write loops, the program pulses Pp(1) to Pp(Na−1) applied in the program operation may change the memory cell MC (A) to the A level. Because not many memory cells MC (A) change to the A level, however, the program operation is followed by only one verify operation. The verify pulses Pv1(1) to Pv1(Na−1) used in the first verify operation have a stepped waveform of having gradually increased voltages of the verify voltage Va at the A level, the verify voltage Vb at the B level, and the verify voltage Vc at the C level. Note that the verify pulses Pv1(Na) to Pv1(N) used in the first verify operation of the subsequent write loops have the same waveform as the verify pulse Pv1(1).

Then, in the Na-th to Na'-th write loops, the program pulses Pp(Na) to Pp(Na') applied in the program operation change many of the memory cells MC(A) to the A level. Here, therefore, the program operation is followed by two verify operations. The threshold voltage distribution of the memory cell MC(A) may thus be narrowed. The verify pulses Pv2(Na) to Pv2(Na') used in the second verify operation are the same as the verify pulses Pv1(Na) to Pv1(Na') used in the first verify operation. Using the same verify pulses in the first and second verify operations may thus simplify the control circuit or the like. The verify pulse Pv2 used in the second verify operation of the subsequent write loops is the same as the verify pulse Pv1 used in the first verify operation. Note that the second verify operation sets, as described above, the precharge select to the adjacent cells.

Then, in the (Na'+1)th to (Nb−1)th write loops, the program pulses Pv(Na'+1) to Pv(Nb−1) applied in the program operation may change the memory cells MC(A) and MC(B) to the respective A and B levels. Because not many memory cells MC(A) and MC(B) change to the A and B levels, however, the program operation is followed by only one verify operation.

Then, in the Nb-th to Nb'-th write loops, the program pulses Pp(Nb) to Pp(Nb') applied in the program operation change many of the memory cells MC(B) to the B level. Here, therefore, the program operation is followed by two verify operations. As a result, the threshold voltage distribution of the memory cell MC(B) may be narrowed.

Then, in the (Nb'+1)th to (Nc−1)th write loops, the program pulses Pp (Nb'+1) to Pp (Nc−1) applied in the program operation may change the memory cells MC(B) and MC(C) to the respective B and C levels. Because not many memory cells MC(B) and MC(C) change to the B and C levels, however, the program operation is followed by only one verify operation.

Then, in the Nc-th to Nc'-th write loops, the program pulses Pp(Nc) to Pp(Nc') applied in the program operation change many of the memory cells MC(C) to the C level. Here, therefore, the program operation is followed by two verify operations. As a result, the threshold voltage distribution of the memory cell MC(C) may be narrowed.

Finally, in the (Nc'+1)th to N-th write loops, the program pulses Pp(Nc'+1) to Pp(N) applied in the program operation may change the memory cell MC(C) to the C level. Because not many memory cells MC(C) change to the C level, however, the program operation is followed by only one verify operation.

As described above, the write operation in this embodiment alternately repeats the first operation mode period of performing one or more continuous write loops in the first operation mode (such as in FIG. 5, the 1st to (Na−1)th write loops periods or the like) and the second operation mode period of performing one or more continuous write loops in the second operation mode (such as in FIG. 5, the Na-th to Na'-th write loop periods). Note that the second operation mode period appears, in the non-volatile semiconductor memory device using a memory cell for storing N values per cell (N is an integer of two or more), in the range from one to (N−1) times.

Thus, according to this embodiment, in the above write loop, when the write to the focused cell is almost completed, even if the focused cell does not pass the verify in the first verify operation, it may pass the verify in the second verify operation. As a result, in the program operation of the subsequent write loops, the program to the focused cell may be inhibited and thus the threshold voltage distribution of the focused cell may be narrowed.

Second Embodiment

A second embodiment provides a non-volatile semiconductor memory device that uses a verify pulse different from that in the second verify operation of the non-volatile semiconductor memory device according to the first embodiment. Focusing on the modification, a description is given below referring to FIG. 6.

First, the 1st to (Na−1)th write loops are similar to those in the example in FIG. 5 and thus their description is omitted here.

Then, in the Na-th to Na'-th write loops, like the example in FIG. 5, the program operation is followed by two verify operations. Note that because not many memory cells MC change to the B or C level, the second verify operation only for the A level is performed. In the second verify operation, therefore, trapezoidal verify pulses Pv2(Na) to Pv2(Na') each having a height of the verify voltage Va at the A level are used. In this way, the verify for the B and C levels may be skipped, thus reducing the time for the second verify operation.

The next (Na'+1)th to (Nb−1)th write loops are similar to those in the example in FIG. 5 and thus their description is omitted here.

Then, in the Nb-th to Nb'-th write loops, like the example in FIG. 5, the program operation is followed by two verify operations. Note that because not many memory cells MC change to the A or C level, the second verify operation only for the B level is performed. In the second verify operation, therefore, trapezoidal verify pulses Pv2(Nb) to Pv2(Nb') each having a height of the verify voltage Vb at the B level are used.

The next (Nb'+1)th to (Nc−1)th write loops are similar to those in the example in FIG. 5 and thus their description is omitted here.

Then, in the Nc-th to Nc'-th write loops, like the example in FIG. 5, the program operation is followed by two verify operations. Note that because not many memory cells MC change to the A or B level, the second verify operation only for the C level is performed. In the second verify operation, therefore, trapezoidal verify pulses Pv2(Nc) to Pv2(Nc') each having a height of the verify voltage Vc at the C level are used.

The last (Nc'+1)th to N-th write loops are similar to those in the example in FIG. 5 and thus their description is omitted here.

Figure 7:
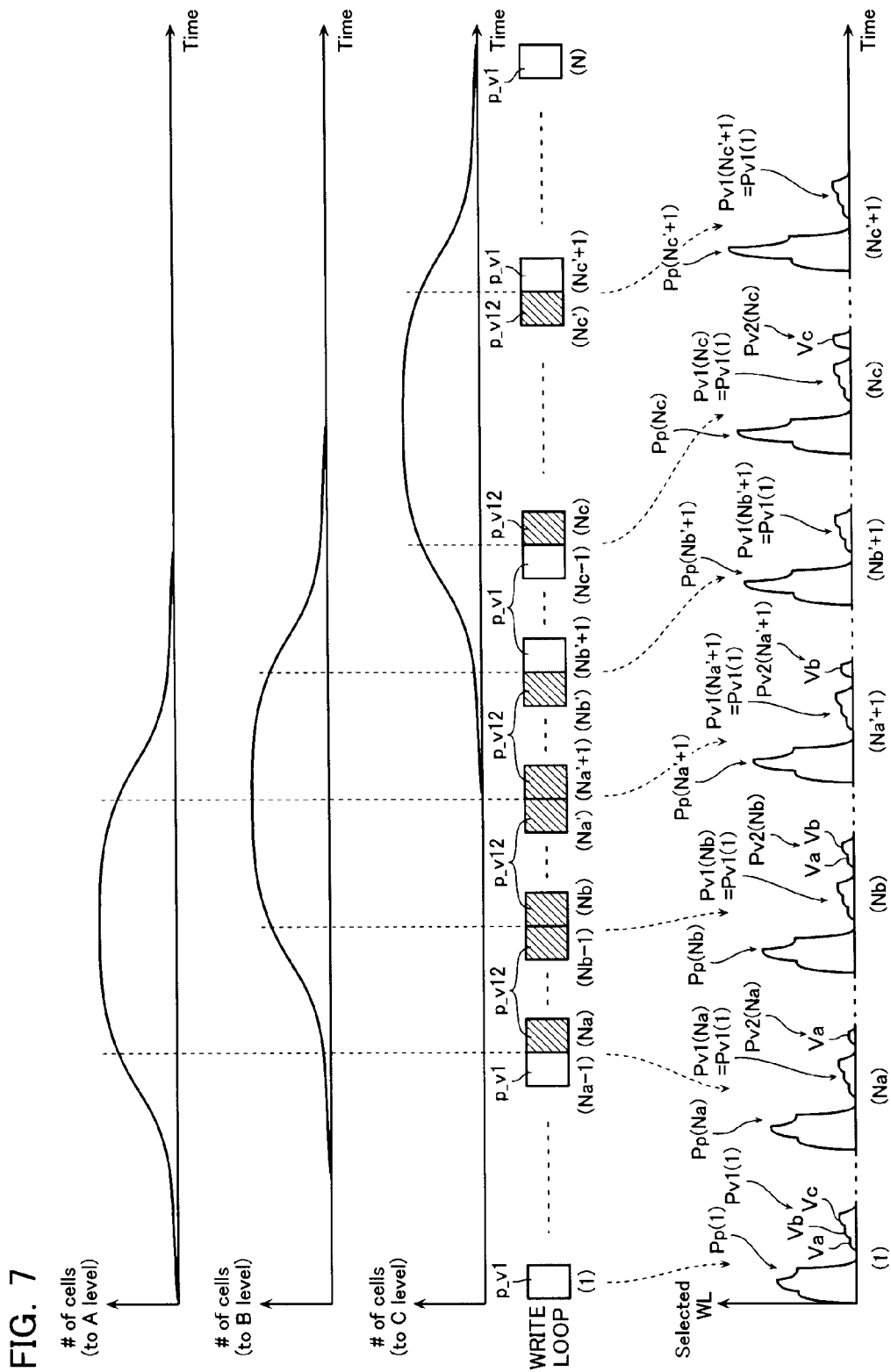
FIG. 7 shows the relationship between the number of memory cells in which the write is completed, the write loop, and the word-line voltage in the non-volatile semiconductor memory device according to this embodiment.

Referring now to FIG. 7, another example of the non-volatile semiconductor memory device according to this embodiment will be described. FIG. 7 shows an example where the range of the number of write loops in which many of the memory cells MC(A) change to the A level overlaps the range of the number of write loops in which many of the memory cells MC(B) change to the B level. Here, the number of write loops has a relationship of 1<Na<Nb<Na'<Nb'<Nc<Nc'<N.

Figure 6:
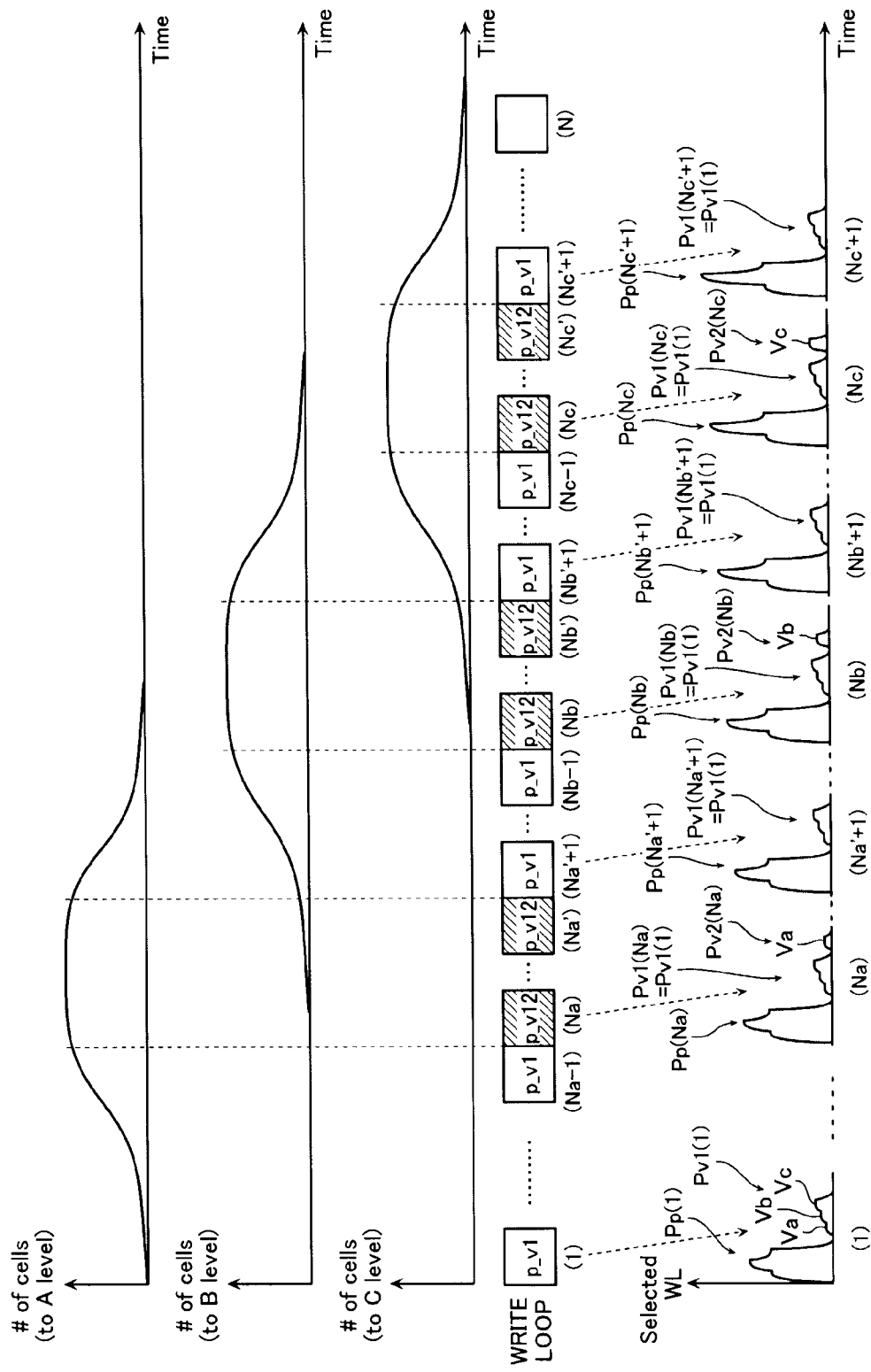
FIG. 6 shows the relationship between the number of memory cells in which the write is completed, the write loop, and the word-line voltage in the non-volatile semiconductor memory device according to a second embodiment.

The 1st to (Na−1)th write loops are similar to those in the example in FIG. 6 and thus their description is omitted here.

The next Na-th to (Nb−1)th write loops are similar to the Na-th to Na'-th write loops in the example of FIG. 6 and thus their description is omitted here.

Then, in the Nb-th to Na'-th write loops, the program pulses Pp(Nb) to Pp(Na') applied in the program operation change many of the memory cells MC(A) and MC(B) to the respective A and B levels. Here, therefore, the second verify operation only for the A and B level is performed. In the second verify operation, therefore, the verify pulses each have a stepped waveform of having gradually increased voltages of the verify voltage Va at the A level and the verify voltage Vb at the B level.

The next (Na'+1)th to Nb'-th write loops are similar to the Nb-th to Nb'-th write loops in the example in FIG. 6 and thus their description is omitted here.

The subsequent (Nb'+1)th to N-th write loops are similar to those in the example in FIG. 6 and thus their description is omitted here.

Note that in the example in FIG. 7, two periods of the second operation mode appear: the period of the Na-th to Nb'-th write loops; and the period of the Nc-th to Nc'-th write loops.

Thus, this embodiment may provide a similar effect to that in the first embodiment and also reduce the time for the second verify operation. As a result, this embodiment may perform the write process faster than the first embodiment.

Third Embodiment

A third embodiment provides a non-volatile semiconductor memory device that applies a verify skip function for skipping extra verify to the non-volatile semiconductor memory device according to the first embodiment.

Figure 8:
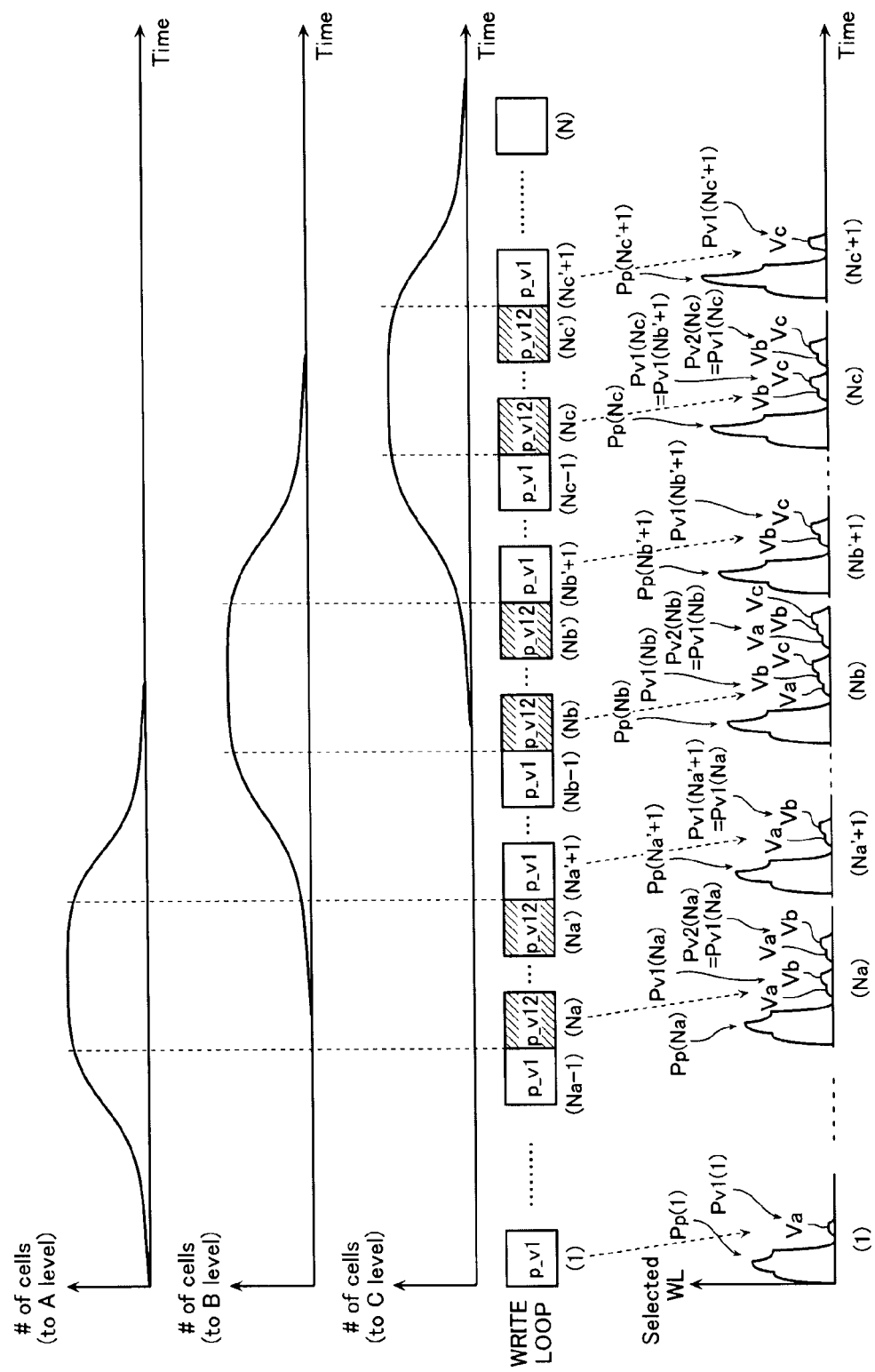
FIG. 8 shows the relationship between the number of memory cells in which the write is completed, the write loop, and the word-line voltage a non-volatile semiconductor memory device according to a third embodiment.
Figure 9:
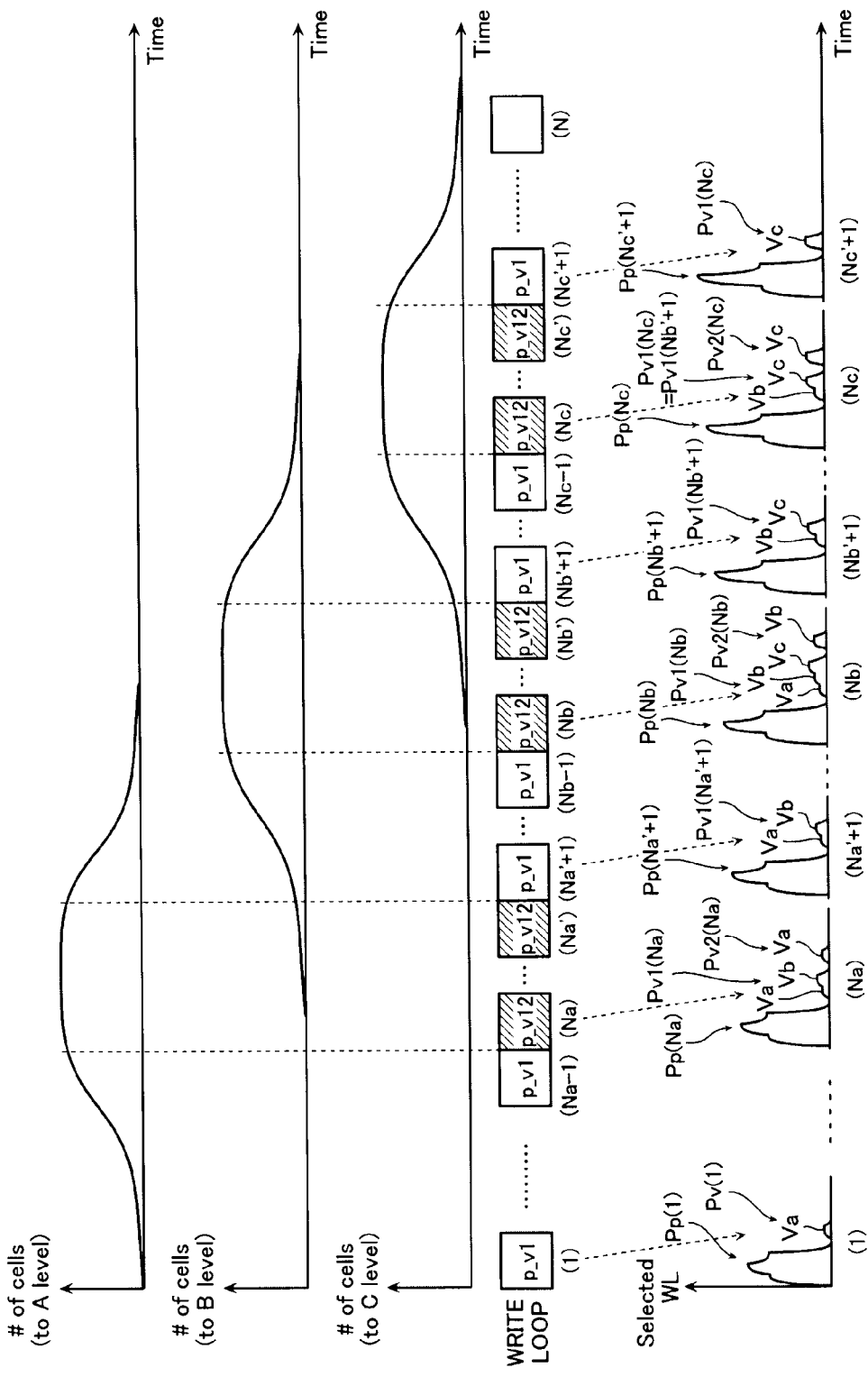
FIG. 9 shows the relationship between the number of memory cells in which the write is completed, the write loop, and the word-line voltage in a non-volatile semiconductor memory device according to a fourth embodiment.

FIG. 8 illustrates an example operation of the non-volatile semiconductor memory device according to this embodiment, showing the relationship between the number of memory cells in which the write is completed, the write loop, and the word-line voltage. Note that the number of write loops has a relationship of 1<Na<Nb<Na'<Nb'<Nc<Nc'<N.

First, in the 1st to (Na−1)th write loops, like the example in FIG. 5, the program operation is followed by only one verify operation. Note that the program pulse Pp(1) applied in the program operation may change the memory cell MC(A) to the A level, but not to the B or C level. The first verify operation is performed, therefore, only for the A level. The first verify operation uses, therefore, trapezoidal verify pulses Pv1(1) to Pv1(Na−1) each having a height of the verify voltage Va at the A level. In this way, the verify for the B and C levels may be skipped, thus reducing the time for the first verify operation.

Then, in the Na-th to Na'-th write loops, like the example in FIG. 5, the program operation is followed by two verify operations. Note that the program pulses Pp(Na) to Pp(Na') applied in the program operation may change the memory cell MC (A) to the A or B level, but not to the C level. The first verify operation is thus performed for the A and B levels. The first verify operation thus uses stepped verify pulses Pv1(Na) to Pv1(Na') each having gradually increased voltages of the verify voltage Va at the A level and the verify voltage Vb at the B level. Note that the verify pulses Pv2(Na) to Pv2(Na') used in the second verify operation are the same as the verify pulses Pv1(Na) to Pv1(Na') used in the first verify operation. Using the same verify pulses in the first and second verify operations may thus simplify the control circuit or the like.

Then, in the (Na'+1)th to (Nb−1)th write loops, like the example in FIG. 5, the program operation is followed by only one verify operation. Note that because the program pulses Pv1(Na'+1) to Pv1(Nb−1) applied in the program operation may change the memory cell MC to the A or B level, the first verify operation uses the same verify pulses Pv1(Na'+1) to Pv1(Nb−1) as the verify pulse Pv1(Na).

Then, in the Nb-th to Nb'-th write loops, like the example in FIG. 5, the program operation is followed by two verify operations. Note that the program pulses Pp(Nb) to Pp(Nb') applied in the program operation may change the memory cell MC(A) to the A, B, or C level. The first verify operation is thus performed for all of the A, B, and C levels. The first verify operation thus uses stepped verify pulses Pv1(Nb) to Pv1(Nb') each having gradually increased voltages of the verify voltage Va at the A level, the verify voltage Vb at the B level, and the verify voltage Vc at the C level. Note that the verify pulses Pv2(Nb) to Pv2(Nb') used in the second verify operation are the same as the verify pulses Pv1(Nb) to Pv1 (Nb') used in the first verify operation.

Then, in the (Nb'+1)th to (Nc−1)th write loops, like the example in FIG. 5, the program operation is followed by only one verify operation. Note that the program pulses Pp(Nb'+1) to Pp(Nc−1) applied in the program operation may change the memory cell MC to the B or C level, but not to the A level. The first verify operation is thus performed for the B and C levels. The first verify operation thus uses stepped verify pulses Pv2(Nb'+1) to Pv2(Nc−1) each having gradually increased voltages of the verify voltage Vb at the B level and the verify voltage Vc at the C level.

Then, in the Nc-th to Nc'-th write loops, like the example in FIG. 5, the program operation is followed by two verify operations. Note that because the program pulses Pp(Nc) to Pp(Nc') applied in the program operation may change the memory cell MC(A) to the B or C level, the first verify operation uses the same verify pulses Pv1(Nc) to Pv1(Nc') as the verify pulse Pv1(Nb'+1). Note that the verify pulses Pv2 (Nc) to (Nc') used in the second verify operation are the same as the verify pulses Pv1(Nc)) to Pv1(Nc') used in the first verify operation.

Finally, in the (Nc'+1)th to N-th write loops, like the example in FIG. 5, the program operation is followed by only one verify operation. Note that because the program pulses Pv1(Nc'+1) to Pv1(N) applied in the program operation may change the memory cell MC to the C level, the first verify operation uses the same verify pulse Pv1(Nc'+1)+(N) as the verify pulse Pv1(Na).

Thus, this embodiment may provide a similar effect to that in the first embodiment and also reduce the time for the first and second verify operations more than the second embodiment. As a result, this embodiment may perform the write process faster than the first embodiment.

Fourth Embodiment

A fourth embodiment provides a non-volatile semiconductor memory device that uses a verify pulse different from that in the second verify operation in the non-volatile semiconductor memory device according to the third embodiment. Focusing on the modification, a description is given below referring to FIG. 9.

First, the 1st to (Na−1)th write loops are similar to those in the example in FIG. 8 and thus their description is omitted here.

Then, in the Na-th to Na'-th write loops, like the example in FIG. 8, the program operation is followed by two verify operations. Note that because not many memory cells MC change to the B level, the second verify operation only for the A level is performed. The second verify operation uses, therefore, trapezoidal verify pulses Pv2(Na) to Pv2(Na') each having a height of the verify voltage Va at the A level. In this way, the verify for the B level may be skipped, thus reducing the time for the second verify operation.

The next (Na'+1)th to (Nb−1)th write loops are similar to those in the example in FIG. 8 and thus their description is omitted here.

Then, in the Nb-th to Nb'-th write loops, like the example in FIG. 8, the program operation is followed by two verify operations. Note that because not many memory cells MC change to the A or C level, the second verify operation only for the B level is performed. The second verify operation uses, therefore, trapezoidal verify pulses Pv2(Nb) to Pv2(Nb') each having a height of the verify voltage Vb at the B level.

The next (Nb'+1)th to (Nc−1)th write loops are similar to those in the example in FIG. 8 and thus their description is omitted here.

Then, in the Nc-th to Nc'-th write loops, like the example in FIG. 8, the program operation is followed by two verify operations. Note that because not many memory cells MC change to the B level, the second verify operation only for the C level is performed. The second verify operation uses, therefore, trapezoidal verify pulses Pv2(Nc) to Pv2(Nc') each having a height of the verify voltage Vc at the C level.

The last (Nc'+1)th to N-th write loops are similar to those in the example in FIG. 8 and thus their description is omitted here.

Thus, this embodiment may provide a similar effect to that in the third embodiment and also reduce the time for the second verify operation more than the third embodiment. As a result, this embodiment may perform the write process faster than the third embodiment.

Fifth Embodiment

A fifth embodiment provides a non-volatile semiconductor memory device that applies a write speed adjustment function described below to the non-volatile semiconductor memory device according to the first embodiment.
<Write Speed Adjustment Function>

First, the write speed adjustment function is generally described.

The write speed adjustment function senses, in the verify operation, the memory cell in which the write is almost completed and reduces, in the subsequent program operations, the write speed to the memory cell in which the write is almost completed. The broadening of the threshold voltage distribution of the memory cell may thus be reduced.

Figure 10:
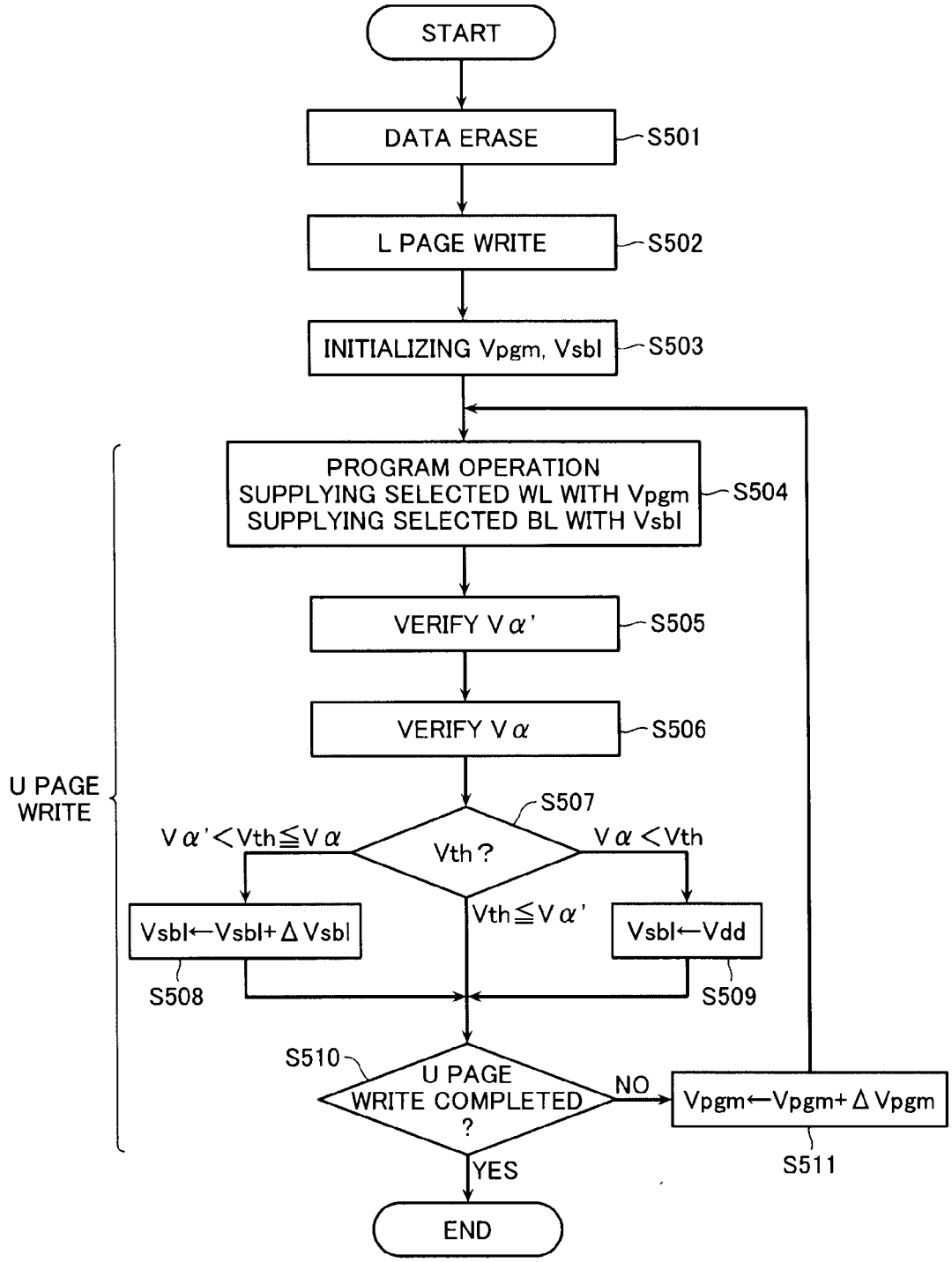
FIG. 10 is a flowchart generally illustrating a write speed adjustment function of a non-volatile semiconductor memory device according to a fifth embodiment.

FIG. 10 is a flowchart of the write speed adjustment function.

First, in step S501, data is erased in units of blocks. All memory cells MC in a page thus change to the ER level.

Then, in step S502, the L page write is performed. The memory cells MC(B) and MC(C) thus change to the LM level as shown in FIG. 3. Note that the memory cell MC(A) remains at the ER level.

Then, in step S503, the programming voltage Vpgm supplied to the selected word-line WL and the selected bit-line voltage Vsbl supplied to the selected bit-line BL are initialized. The selected bit-line voltage Vsbl is, for example, 0V.

In the next steps S504 to S511, the U page write is performed.

In step S504, the program operation is performed. The program operation supplies, with the selected bit-line BL supplied with the selected bit-line voltage Vsbl, the selected word-line WL with the programming voltage Vpgm. The threshold voltages Vth of the memory cells MC in a page thus change in the positive direction.

Then, in step S505, it is verified whether the threshold voltage Vth of the memory cell MC reaches the voltage $V\alpha'$. The voltage $V\alpha'$ (which may hereinafter be referred to as a "preliminary verify voltage") is a voltage slightly lower than the desired voltage $V\alpha$ which the memory cell MC is to be changed to. For example, in FIG. 3, the voltage $V\alpha'$ is the voltage Va' (0.2V) that is 0.2V lower than the voltage Va (0.4V) for the memory cell MC(A).

Then, in step S506, it is verified whether the threshold voltage Vth of the memory cell MC reaches the voltage $V\alpha$. For the memory cell MC(A), the voltage $V\alpha$ is the voltage Va.

Then, in steps S507 to S509, according to the results in steps S505 and S506, the selected bit-line voltage Vsbl used in the program operation of the next write loop is adjusted. If the threshold voltage Vth of the memory cell MC is higher than the voltage $V\alpha$, no program operation is necessary. The selected bit-line voltage Vsbl is thus adjusted to the program-inhibit voltage (for example, the power supply voltage Vdd). If the threshold voltage Vth of the memory cell MC is more than the voltage $V\alpha'$ and no more than the voltage $V\alpha$, the write to the memory cell MC is almost completed and thus the selected bit-line voltage Vsbl is increased by a predetermined voltage LVsbl. In the program operation of the next write loop, therefore, the programming voltage Vpgm is reduced substantially by the voltage $\Delta$Vsbl, thereby reducing the write speed. If the threshold voltage Vth of the memory cell MC is equal to or less than the voltage $V\alpha'$, the write to the memory cell MC is not almost completed. The usual program operation thus needs to continue. Therefore, the selected bit-line voltage Vsbl is not adjusted.

Then, in step S510, it is determined whether the U page write to all memory cells MC in a page is completed. If so, then the write is ended. If not, then the programming voltage Vpgm is increased by a predetermined voltage $\Delta$Vpgm (step S511). The process then returns to step S504, where the write loop is repeated.

Figure 11:
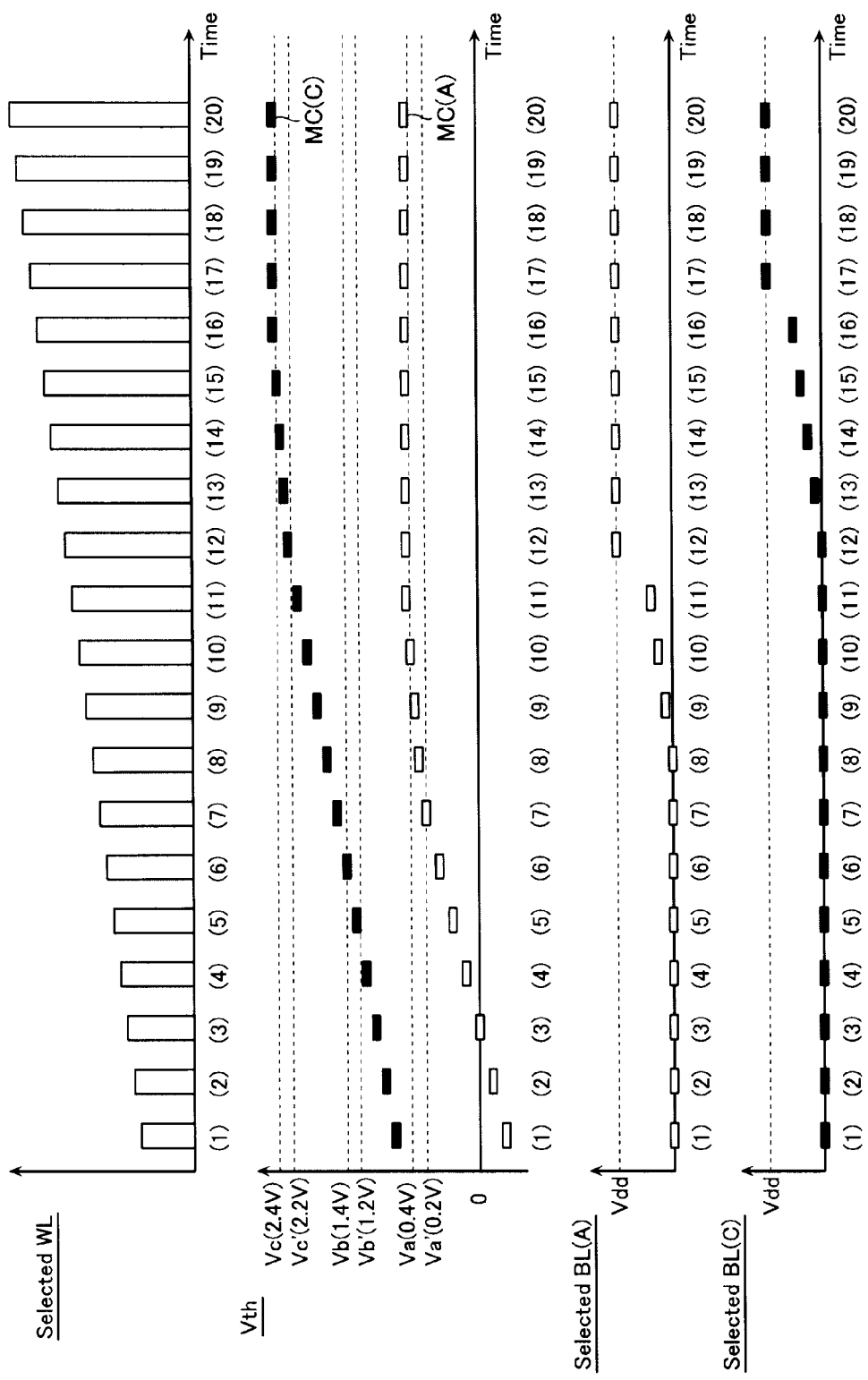
FIG. 11 shows the relationship between the selected word-line voltage, the memory cell threshold voltage, and the selected bit-line voltages in the non-volatile semiconductor memory device according to this embodiment.

FIG. 11 shows the relationship, in the U page write with the write speed adjustment in FIG. 10, between the voltage of the selected word-line WL, the threshold voltage Vth of the memory cell MC, and the voltage of the selected bit-line BL. FIG. 11 illustrates two certain memory cells MC(A) and MC(C) in a page. The selected bit-line connected to the memory cell MC(A) is expressed as the BL(A), and the selected bit-line connected to the memory cell MC(C) is expressed as the BL(C). Note that when the L page write is completed, the memory cell MC(A) is changed to the ER level and the memory cell MC(C) is changed to the LM level.

The programming voltage applied to the selected word-line WL is increased every time the write loop is repeated. The threshold voltages Vth of the memory cells MC(A) and MC(C) are changed in the positive direction, accordingly.

When the seventh write loop is completed, the threshold voltages Vth of the memory cells MC(A) and MC(C) do not reach the respective voltages Va' and Vc'.

In the eighth write loop, the threshold voltage Vth of the memory cell MC (A) exceeds the voltage Va' for the first time. In the program operations of the 9th or more write loops, therefore, the selected bit-line voltage Vsbl supplied to the bit-line BL (A) is increased by a predetermined voltage $\Delta$Vsbl, thereby decreasing the write speed of the memory cell MC(A). This may avoid the situation in which the threshold voltage Vth of the memory cell MC(A) largely exceeds the voltage Va in the program operations of the 9th or more write loops.

In the 11th write loop, the threshold voltage Vth of the memory cell MC(A) exceeds the voltage Va for the first time. This means that the write is completed. In the 12th or more write loops, therefore, the selected bit-line BL(A) is supplied with the program inhibit voltage Vdd, thereby inhibiting the program operation to the memory cell MC (A).

In the 12th write loop, the threshold voltage Vth of the memory cell MC (C) exceeds the voltage Vc' for the first time. In the program operation of the 13th or more write loops, therefore, the selected bit-line voltage Vsbl supplied to the selected bit-line BL (C) is increased by a predetermined voltage $\Delta$Vsbl, thereby decreasing the write speed of the memory cell MC (C). This may avoid the situation in which the threshold voltage Vth of the memory cell MC (C) largely exceeds the voltage Vc.

Thus, with the write speed adjustment function, a memory cell in which the write is almost completed is subjected to an accurate program operation for reducing the write speed. The threshold voltage distribution of the memory cell may thus be narrowed.

<Write Operation>

Figure 12:
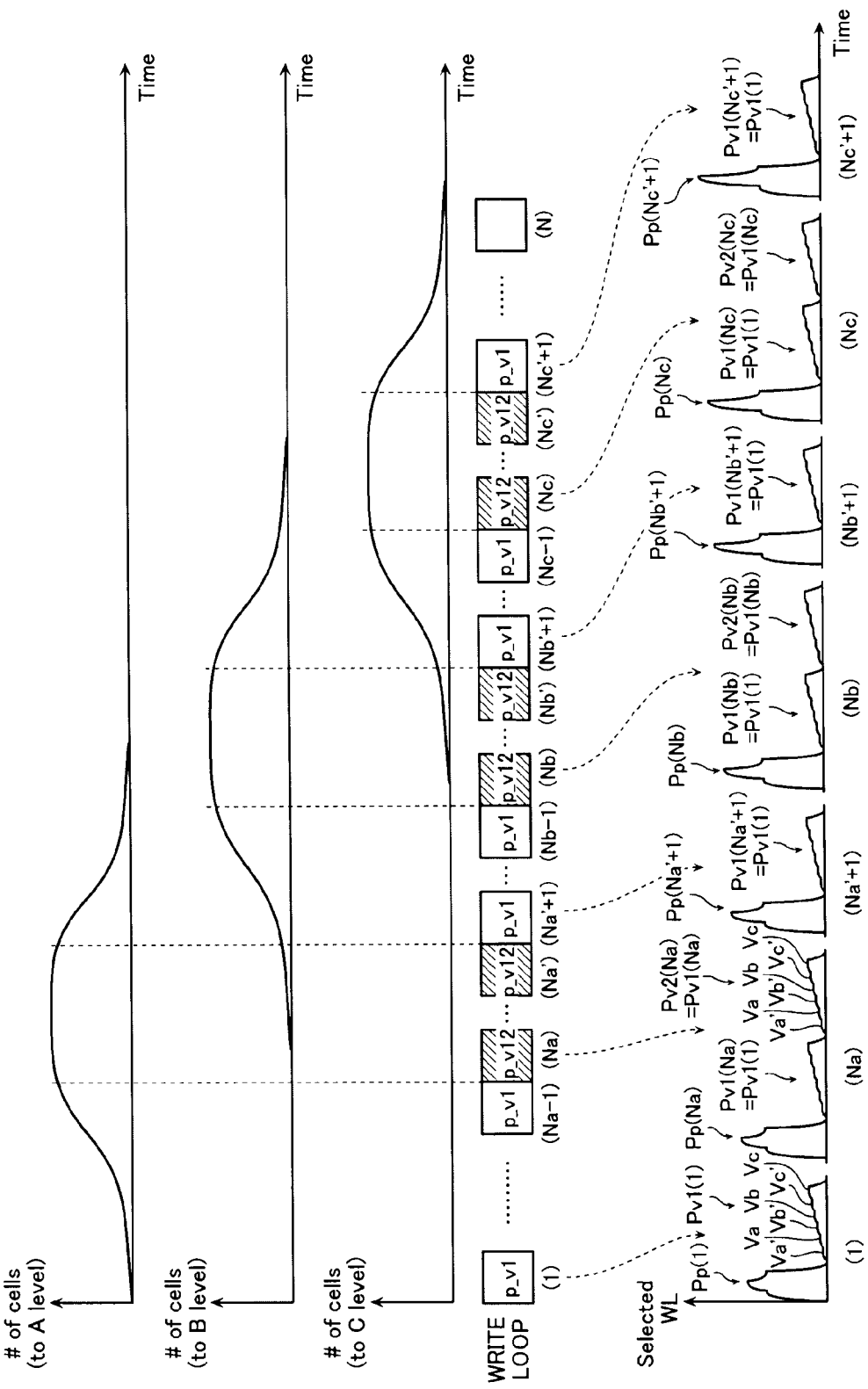
FIG. 12 shows the relationship between the number of memory cells in which the write is completed, the write loop, and the word-line voltage in the non-volatile semiconductor memory device according to this embodiment.
Figure 13:
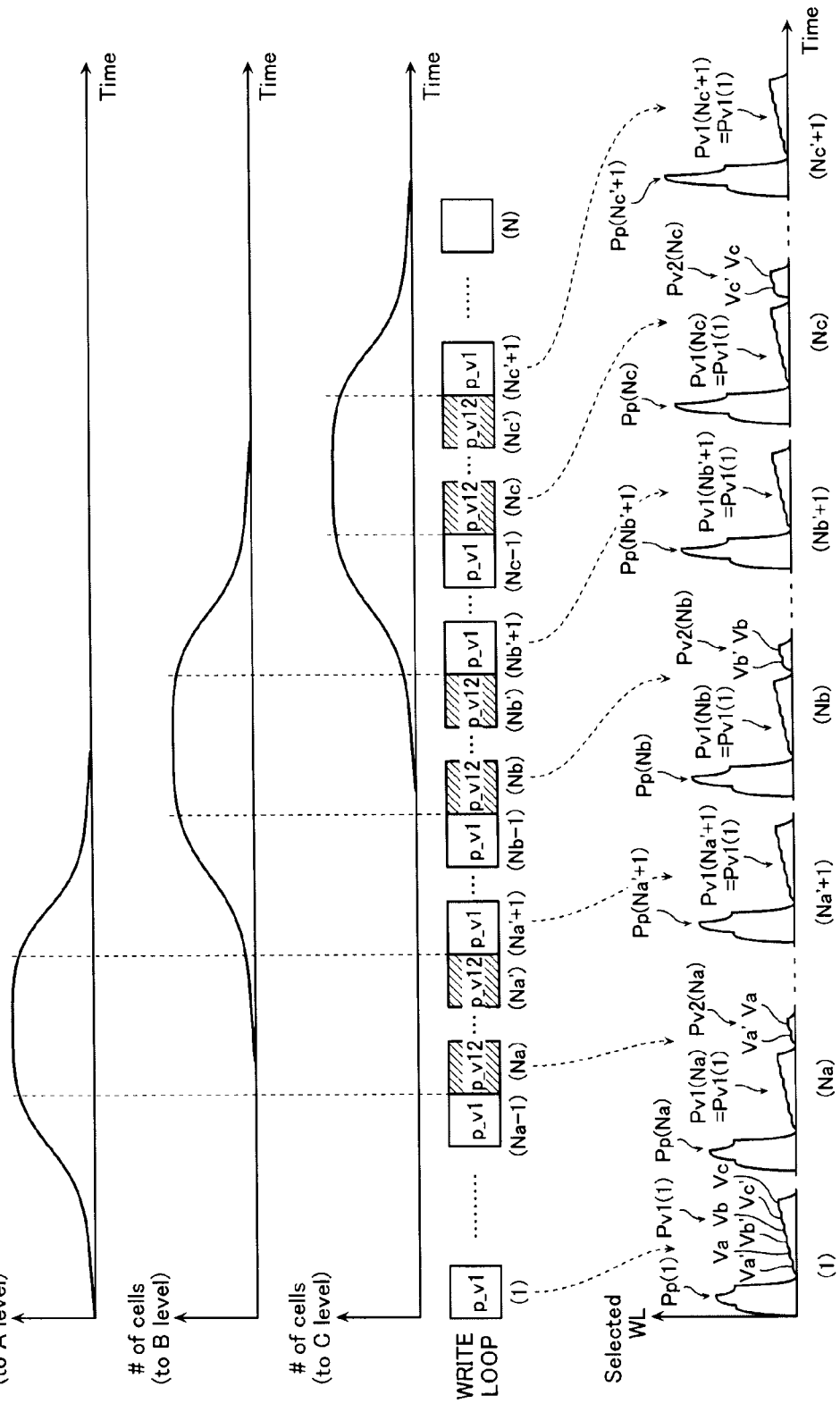
FIG. 13 shows the relationship between the number of memory cells in which the write is completed, the write loop, and the word-line voltage in a non-volatile semiconductor memory device according to a sixth embodiment.

Referring now to FIG. 12, a description is given of the write operation to the non-volatile semiconductor memory device according to this embodiment. FIG. 12 shows an example relationship between the number of memory cells in which the write is completed, the write loop, and the word-line voltage.

First, in the 1st to (Na−1)th write loops, like the example shown in FIG. 5, the program operation is followed by one verify operation. Note that because of the write speed adjustment function, each of the verify pulses Pv1(1) to Pv1(Nac−1) used in the first verify operation is a stepped waveform having sequentially increased voltages of the preliminary verify voltage Va' and the verify voltage Va at the A level, the preliminary verify voltage Vb' and the verify voltage Vb at the B level, and the preliminary verify voltage Vc' and the verify voltage Vc at the C level (Va'<Va<Vb'<Vb<Vc'<Vc). The verify pulses Pv1(Na) to Pv1(N) used in the first verify operation of the subsequent write loops are the same as the verify pulse Pv1(1).

Then, in the Na-th to Na'-th write loops, like the example shown in FIG. 5, the program operation is followed by two verify operations. The verify pulses Pv2(Na) to Pv2(Na') used in the second verify operation are the same as the verify pulses Pv1(Na) to Pv1(Na') used in the first verify operation. Using the same verify pulses in the first and second verify operations may thus simplify the control circuit or the like. The verify pulse Pv2 used in the second verify operation of the subsequent write loops is the same as the verify pulse Pv1 used in the first verify operation.

The subsequent (Na'+1)th to N-th write loops are similar to those in the example in FIG. 5 except that the verify pulse Pv1 used in the first verify operation is different from the verify pulse Pv2 used in the second verify operation. Their description is thus omitted here.

Thus, this embodiment may provide a similar effect to that in the first embodiment and also further narrow the threshold distribution of the memory cell using the write speed adjustment function than the first embodiment.

Sixth Embodiment

A sixth embodiment is a non-volatile semiconductor memory device that uses a second verify operation different from that in the non-volatile semiconductor memory device according to the fifth embodiment. Focusing on the modification, a description is given below referring to FIG. 13.

The 1st to (Na−1)th write loops are similar to those in the example in FIG. 12 and thus their description is omitted here.

Then, in the Na-th to Na'-th write loops, like the example in FIG. 12, the program operation is followed by two verify operations. Note that because not many memory cells MC change to the B or C level, the second verify operation only for the A level is performed. The second verify operation uses, therefore, stepped verify pulses Pv2(Na) to Pv2(Na') each having gradually increased voltages of the preliminary verify voltage Va' and the verify voltage Va at the A level. In this way, the verify for the B and C levels may be skipped, thus reducing the time for the second verify operation.

The next (Na'+1)th to (Nb−1)th write loops are similar to those in the example in FIG. 12 and thus their description is omitted here.

Then, in the Nb-th to Nb'-th write loops, like the example in FIG. 12, the program operation is followed by two verify operations. Note that because not many memory cells MC change to the A or C level, the second verify operation only for the B level is performed. The second verify operation uses, therefore, stepped verify pulses Pv2(Nb) to Pv2(Nb') each having gradually increased voltages of the preliminary verify voltage Vb' and the verify voltage Vb at the B level.

The next (Nb'+1)th to (Nc−1)th write loops are similar to those in the example in FIG. 12 and thus their description is omitted here.

Then, in the Nc-th to Nc'-th write loops, like the example in FIG. 12, the program operation is followed by two verify operations. Note that because not many memory cells MC change to the A or B level, the second verify operation only for the C level is performed. In the second verify operation, therefore, stepped verify pulses Pv2(Nc) to Pv2(Nc') each having gradually increased voltages of the preliminary verify voltage Vc' and the verify voltage Vc at the C level.

The last (Nc'+1)th to N-th write loops are similar to those in the example in FIG. 12 and thus their description is omitted here.

Thus, this embodiment may provide a similar effect to that in the fifth embodiment and also reduce the time for the second verify operation more than the fifth embodiment. As a result, this embodiment may perform the write process faster than the fifth embodiment.

Seventh Embodiment

The seventh embodiment provides a non-volatile semiconductor memory device that applies a verify skip function for skipping extra verify to the non-volatile semiconductor memory device according to the fifth embodiment.

Figure 14:
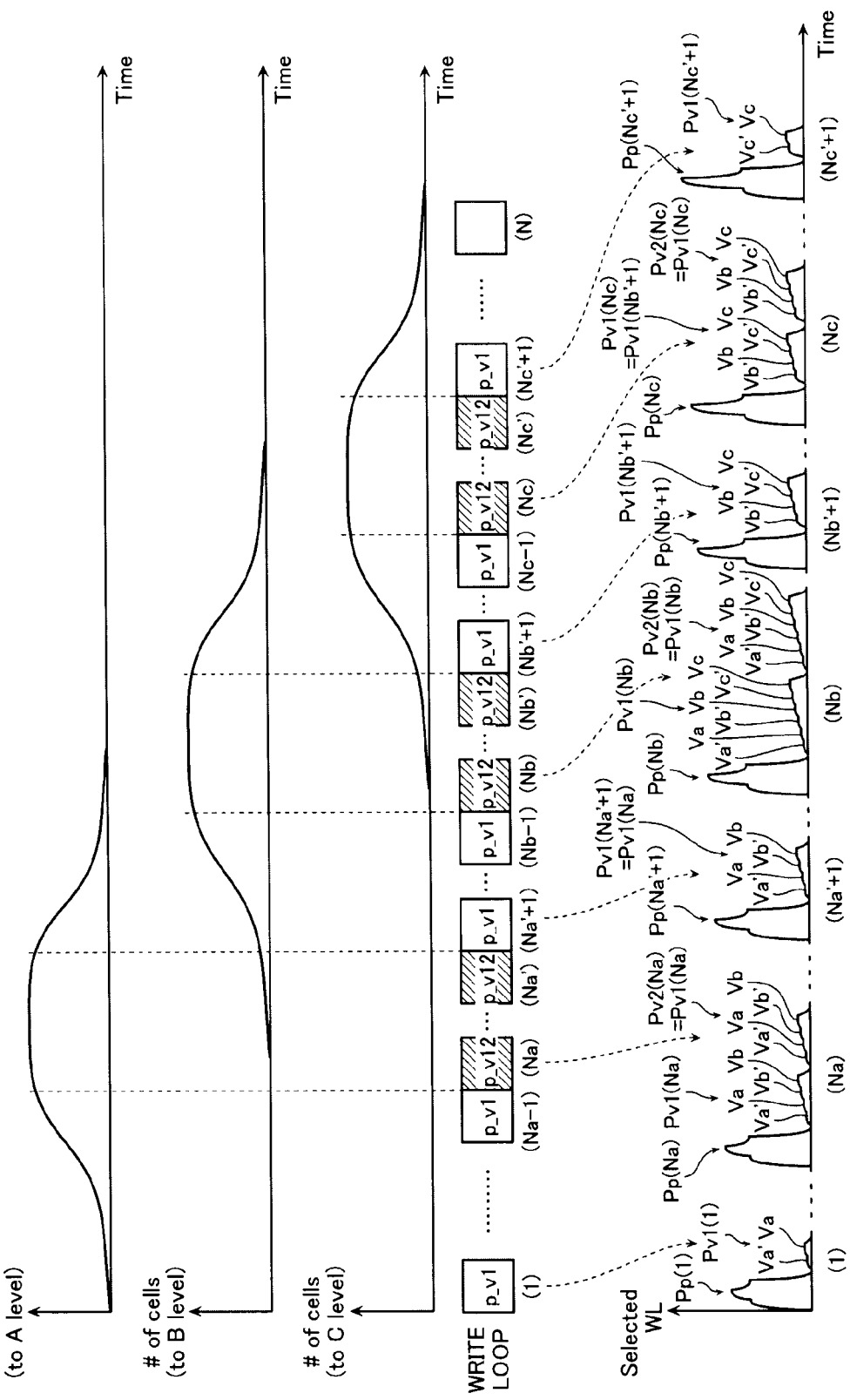
FIG. 14 shows the relationship between the number of memory cells in which the write is completed, the write loop, and the word-line voltage in a non-volatile semiconductor memory device according to a seventh embodiment.
Figure 15:
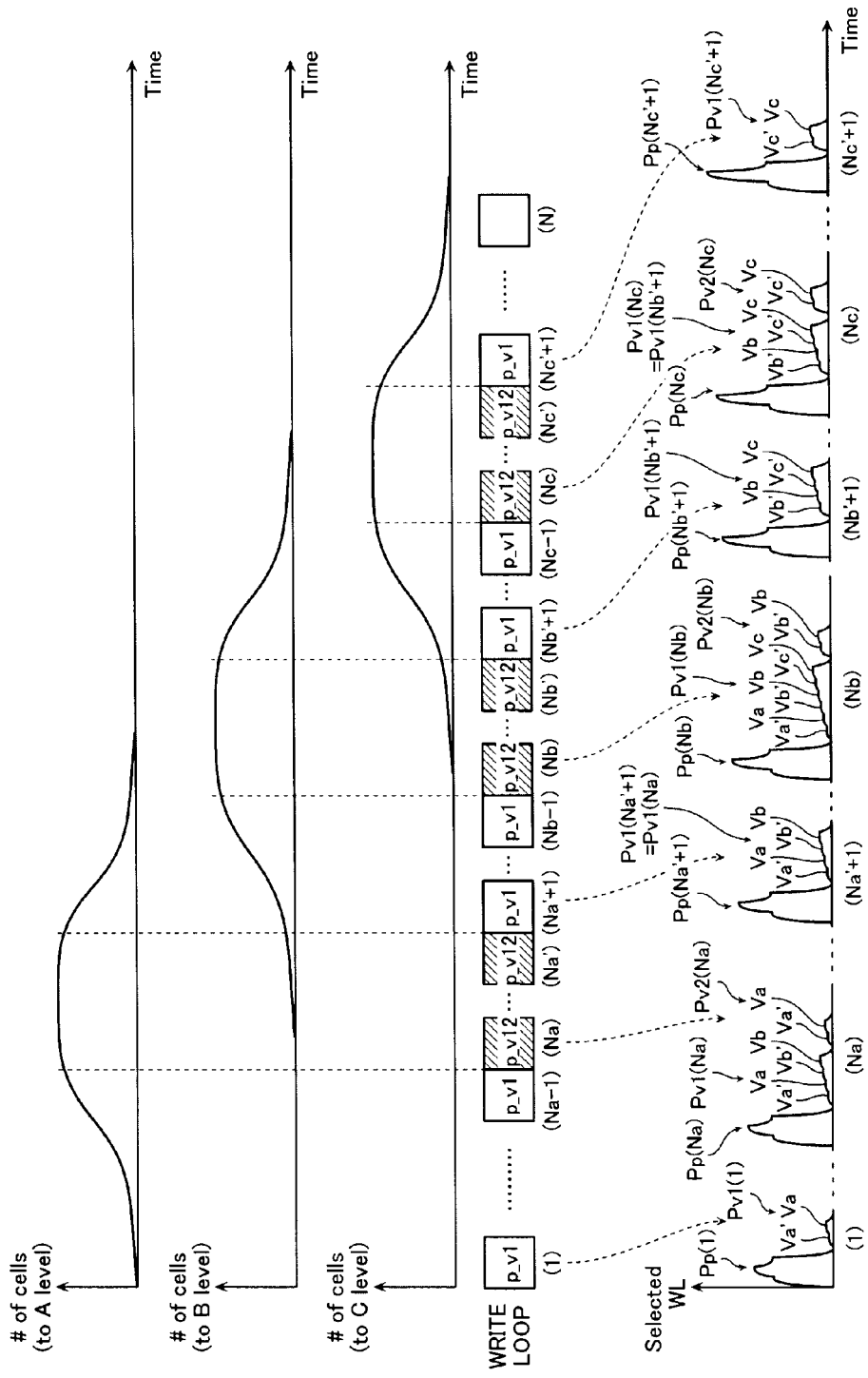
FIG. 15 shows the relationship between the number of memory cells in which the write is completed, the write loop, and the word-line voltage in a non-volatile semiconductor memory device according to an eighth embodiment.

FIG. 14 illustrates an example operation of the non-volatile semiconductor memory device according to this embodiment, showing the relationship between the number of memory cells in which the write is completed, the write loop, and the word-line voltage.

First, in the 1st to (Na−1)th write loops, like the example in FIG. 12, the program operation is followed by only one verify operation. Note that the program pulse Pp(1) applied in the program operation may change the memory cell MC(A) to the A level, but not to the B or C level. The first verify operation is performed, therefore, only for the A level. The first verify operation uses, therefore, stepped verify pulses Pv1(1) to Pv1(Na−1) each having gradually increased voltages of the preliminary verify voltage Va' and the verify voltage Va at the A level. In this way, the verify for the B and C levels may be skipped, thus reducing the time for the first verify operation.

Then, in the Na-th to Na'-th write loops, like the example in FIG. 12, the program operation is followed by two verify operations. Note that the program pulses Pp(Na) to Pp(Na') applied in the program operation may change the memory cell MC to the A or B level, but not to the C level. The first verify operation is thus performed for the A and B levels. The first verify operation uses, therefore, stepped verify pulses Pv1(Na) to Pv1(Na') each having gradually increased voltages of the preliminary verify voltage Va' and the verify voltage Va at the A level and the preliminary verify voltage Vb' and the verify voltage Vb at the B level. Note that the verify pulses Pv2(Na) to Pv2(Na') used in the second verify operation are the same as the verify pulses Pv1(Na) to Pv1(Na') used in the first verify operation. Using the same verify pulses in the first and second verify operations may thus simplify the control circuit or the like.

Then, in the (Na'+1)th to (Nb−1)th write loops, like the example in FIG. 12, the program operation is followed by only one verify operation. Note that because the program pulses Pv1(Na'+1) to Pv1(Nb−1) applied in the program operation may change the memory cell MC to the A or B level, the first verify operation uses the same verify pulses Pv1(Na'+1)+Pv1(Nb−1) as the verify pulse Pv1(Na).

Then, in the Nb-th to Nb'-th write loops, like the example in FIG. 12, the program operation is followed by two verify operations. Note that the program pulses Pp(Nb) to Pp(Nb') applied in the program operation may change the memory cell MC (A) to the A, B, or C level. The first verify operation is thus performed for all of the A, B, and C levels. The first verify operation uses, therefore, stepped verify pulses Pv1(Nb) to Pv1(Nb') each having gradually increased voltages of the preliminary verify voltage Va' and the verify voltage Va at the A level, the preliminary verify voltage Vb' and the verify voltage Vb at the B level, and the preliminary verify voltage Vc' and the verify voltage Vc at the C level. Note that the verify pulses Pv2(Nb) to Pv2(Nb') used in the second verify operation are the same as the verify pulses Pv1(Nb) to Pv1(Nb') used in the first verify operation.

Then, in the (Nb'+1)th to (Nc−1)th write loops, like the example in FIG. 12, the program operation is followed by only one verify operation. Note that the program pulses Pp(Nb'+1) to Pp(Nc−1) applied in the program operation may change the memory cell MC to the B or C level, but not to the A level. The first verify operation is thus performed for the B and C levels. The first verify operation uses, therefore, stepped verify pulses Pv2(Nb'+1) to Pv2(Nc−1) each having gradually increased voltages of the preliminary verify voltage Vb' and the verify voltage Vb at the B level and the preliminary verify voltage Vc' and the verify voltage Vc at the C level.

Then, in the Nc-th to Nc'-th write loops, like the example in FIG. 12, the program operation is followed by two verify operations. Note that because the program pulses Pp(Nc) to Pp(Nc') applied in the program operation may change the memory cell MC(A) to the B or C level, the first verify operation uses the same verify pulses Pv1(Nc) to Pv1(Nc') as the verify pulse Pv1(Nb'+1). Note that the verify pulses Pv2

(Nc) to (Nc') used in the second verify operation are the same as the verify pulses Pv1(Nc)) to Pv1(Nc') used in the first verify operation.

Finally, in the (Nc'+1)th to N-th write loops, like the example in FIG. 12, the program operation is followed by only one verify operation. Note that because the program pulses Pv1(Nc'+1) to Pv1(N) applied in the program operation may change the memory cell MC to the C level, the first verify operation uses stepped verify pulses Pv1(Nc'+1) to Pv1(N) each having gradually increased voltages of the preliminary verify voltage Vc' and the verify voltage Vc at the C level.

Thus, this embodiment may provide a similar effect to that in the fifth embodiment and also reduce the time for the first and second verify operations more than the fifth embodiment. As a result, this embodiment may perform the write process faster than the fifth embodiment.

Eighth Embodiment

The eighth embodiment provides a non-volatile semiconductor memory device that uses a verify pulse different from that in the second verify operation of the non-volatile semiconductor memory device according to the seventh embodiment. Focusing on the modification, a description is given below referring to FIG. 15.

The 1st to (Na−1)th write loops are similar to those in the example in FIG. 14 and thus their description is omitted here.

Then, in the Na-th to Na'-th write loops, like the example in FIG. 14, the program operation is followed by two verify operations. Note that because not many memory cells MC change to the B level, the second verify operation only for the A level is performed. The second verify operation uses, therefore, stepped verify pulses Pv2(Na) to Pv2(Na') each having gradually increased voltages of the preliminary verify voltage Va' and the verify voltage Va at the A level. In this way, the verify for the B level may be skipped, thus reducing the time for the second verify operation.

The next (Na'+1)th to (Nb−1)th write loops are similar to those in the example in FIG. 14 and thus their description is omitted here.

Then, in the Nb-th to Nb'-th write loops, like the example in FIG. 14, the program operation is followed by two verify operations. Note that because not many memory cells MC change to the A or C level, the second verify operation only for the B level is performed. The second verify operation uses, therefore, stepped verify pulses Pv2(Nb) to Pv2(Nb') each having gradually increased voltages of the preliminary verify voltage Vb' and the verify voltage Vb at the B level.

The next (Nb'+1)th to (Nc−1) th write loops are similar to those in the example in FIG. 14 and thus their description is omitted here.

Then, in the Nc-th to Nc'-th write loops, like the example in FIG. 14, the program operation is followed by two verify operations. Note that because not many memory cells MC change to the B level, the second verify operation only for the C level is performed. The second verify operation uses, therefore, stepped verify pulses Pv2(Nc) to Pv2(Nc') each having gradually increased voltages of the preliminary verify voltage Vc' and the verify voltage Vc at the C level.

The last (Nc'+1)th to N-th write loops are similar to those in the example in FIG. 14 and thus their description is omitted here.

Thus, this embodiment may provide a similar effect to that in the seventh embodiment and also reduce the time for the second verify operation more than the seventh embodiment. As a result, this embodiment may perform the write process faster than the seventh embodiment.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Although the above embodiments each provide a non-volatile semiconductor memory device including a 2-bit/cell memory cell, the embodiments are applicable to any non-volatile semiconductor memory device including a memory cell of any number of storage bits per cell.

Figure 16:
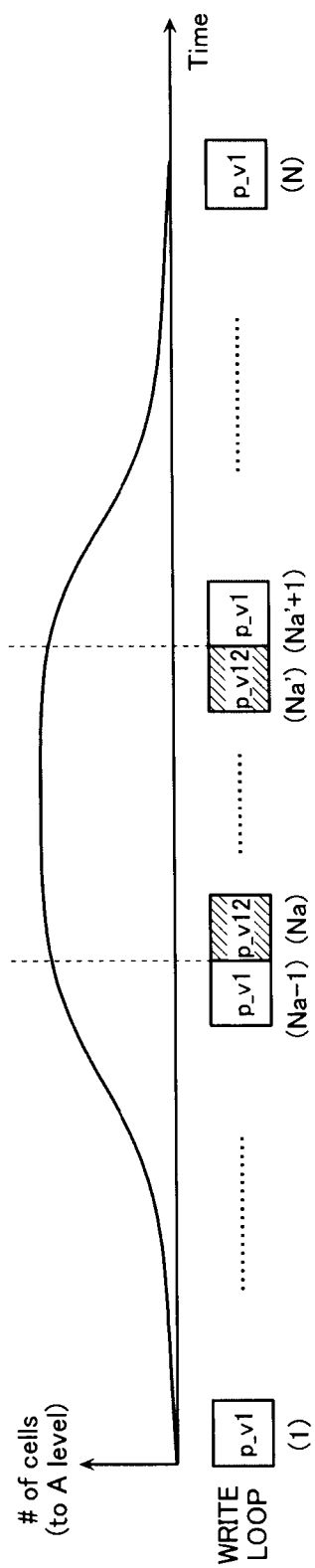
FIG. 16 shows the relationship between the number of memory cells in which the write is completed and the write loop in a non-volatile semiconductor memory device according to another embodiment.

FIG. 16 shows an example of a non-volatile semiconductor memory device using a memory cell of 1-bit/cell. In this example, the write is completed in N write loops. In this case, two verify operations are performed in the Na-th to Na'-th write loops around the write loop in which the number of memory cells that change to the A level reaches the peak, and only one verify operation is performed in the other write loops. The broadening of the threshold voltage distribution at the A level may be reduced.

Figure 17:
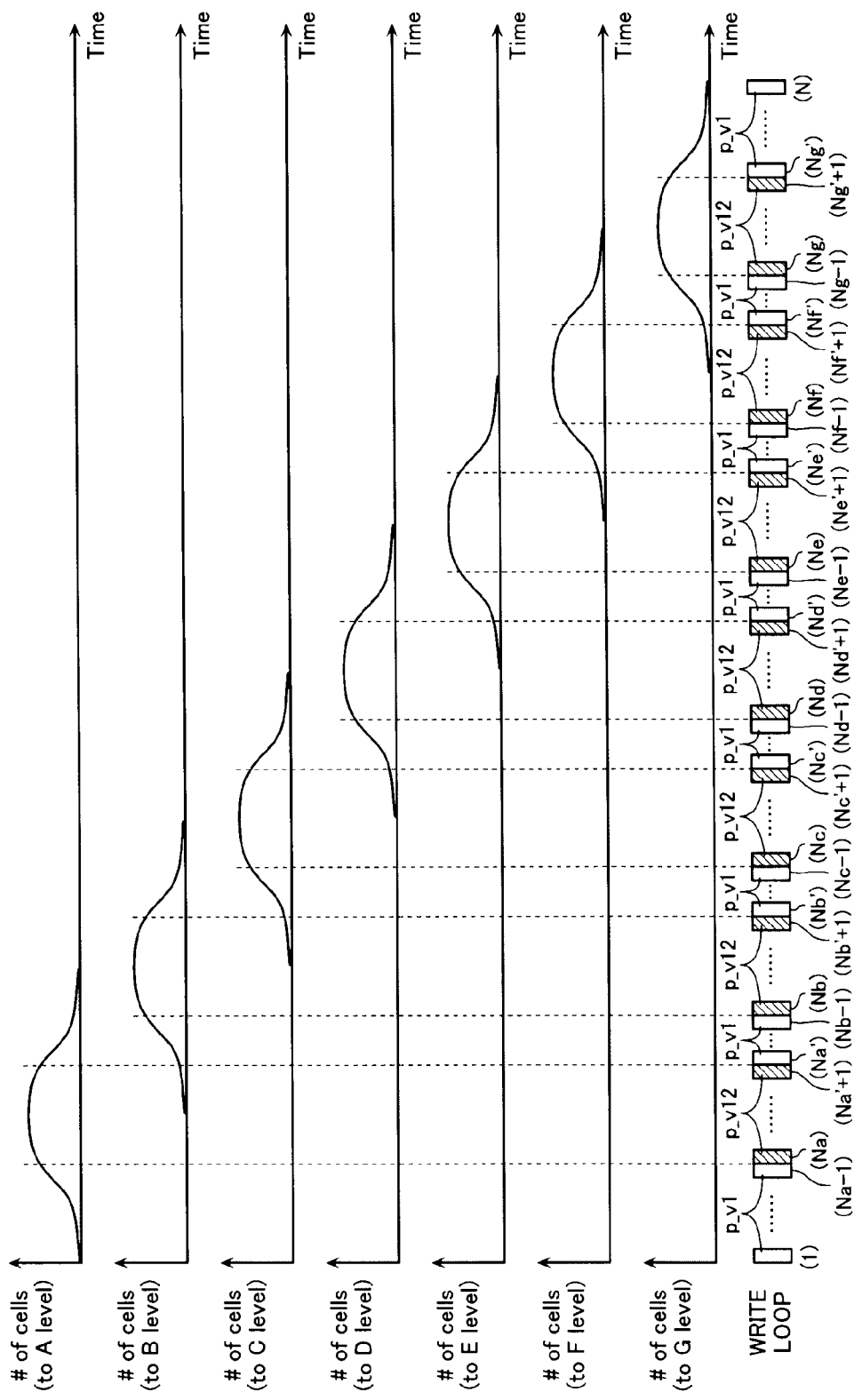
FIG. 17 shows the relationship between the number of memory cells in which the write is completed and the write loop in a non-volatile semiconductor memory device according to another embodiment.

FIG. 17 shows an example of a non-volatile semiconductor memory device using a memory cell of 3-bit/cell. Also in this example, the write is completed in N write loops. In this case, two verify operations are performed in the Na-th to Na'-th write loops around the write loop in which the number of memory cells that change to the A level reaches the peak, the Nb-th to Nb'-th write loops around the write loop in which the number of memory cells that change to the B level reaches the peak, . . . , and the Ng-th to Ng'-th write loops around the write loop in which the number of memory cells that change to the G level reaches the peak, and only one verify operation is performed in the others write loops. This may reduce the broadening of the threshold voltage distributions at the A, B, . . . , G level.

Similarly, even for a non-volatile semiconductor memory device including a memory cell for storing 4-bit per cell or more, two verify operations similar to those in the above embodiments may be performed around the write loop in which the number of memory cells that change to the each level reaches the peak, thereby reducing the broadening of the threshold voltage distribution at each level.

What is claimed is:

1. A non-volatile semiconductor memory device comprising:
a memory cell array comprising a plurality of bit-lines, a plurality of word-lines intersecting the bit-lines, a source-line, and a plurality of NAND strings, each NAND string comprising a plurality of memory cells connected in series, each memory cell comprising a control gate connected to one of the word-lines, each NAND string comprising ends connected to the source-line and one of the bit-lines, respectively; and
a data write portion configured to repeat a write loop of writing data in units of a page comprising a plurality of memory cells connected to one word-line,
the data write portion comprising, in the write loop, a first operation mode of sequentially performing a program operation of recording data to a memory cell and a first verify operation of verifying data record in the memory cell, and a second operation mode of sequentially performing the program operation, the first verify operation, and a second verify operation of verifying data record in the memory cell, the data write portion comprising, in the first verify operation, precharging a bit-line connected to a predetermined first memory cell of the memory cells and a bit-line connected to a second memory cell in the same page as the first memory cell, the second memory cell being adjacent to the first memory cell, and sensing a current through the bit-line connected to the first memory cell to verify data of the first memory cell, then in the second verify operation, when the write to the second memory cell is completed, without precharging the bit-line connected to the second memory cell, precharging the bit-line connected to the first memory cell, and sensing a current through the bit-line connected to the first memory cell to verify data of the first memory cell.

2. The non-volatile semiconductor memory device according to claim 1, wherein each memory cell stores N values per cell (N is an integer of two or more), and the data write portion applies, in the second verify operation of the write loop that may provide most of the memory cells in which the write of the n-th data (1<n<N) is completed, the verify pulse only necessary for the verify of the n-th data to the word-line.

3. The non-volatile semiconductor memory device according to claim 1, wherein in a predetermined write loop performed in the second operation mode, the verify pulse necessary for the first verify operation is substantially the same as the verify pulse necessary for the second verify operation.

4. The non-volatile semiconductor memory device according to claim 1, wherein each memory cell stores N values per cell (N is an integer of two or more), the data write portion applies, in the first verify operation of the write loop that may provide the memory cells in which the write of the n-th data (1<n<N) is completed, the verify pulse only necessary for the verify of the n-th data to the word-line.

5. The non-volatile semiconductor memory device according to claim 1, wherein in the change direction of the threshold voltage of the memory cell by the program operation, with a preliminary verify voltage being defined as a predetermined voltage lower than the desired threshold voltage corresponding to data to be written to the first memory cell, the data write portion verifies, in a predetermined write loop, whether the threshold voltage of the first memory cell has reached the preliminary verify voltage, and according to the verify result, sets the program pulse necessary for the program operation in the next write loop.

6. The non-volatile semiconductor memory device according to claim 5, wherein the increment between the program pulse used in a predetermined write loop and the program pulse used in a next write loop is a first increment for the threshold voltage of the first memory cell having not reached the preliminary verify voltage in the predetermined write loop, and the increment is a second increment for the threshold voltage of the first memory cell having reached the preliminary verify voltage in the predetermined write loop, and the second increment is smaller than the second increment.

7. The non-volatile semiconductor memory device according to claim 1, wherein each memory cell stores N values per cell (N is an integer of two or more), the data write portion uses a stepped verify pulse to perform the first and second verify operations, and the steps of the verify pulse correspond to the respective verify voltages necessary to verify respective data storage.

8. A non-volatile semiconductor memory device comprising:

a memory cell array comprising a plurality of bit-lines, a plurality of word-lines intersecting the bit-lines, a source-line, and a plurality of NAND strings, each NAND string comprising a plurality of memory cells connected in series, each memory cell comprising a control gate connected to one of the word-lines, each NAND string comprising ends connected to the source-line and one of the bit-lines, respectively; and a data write portion configured to repeat a write loop of writing data in units of a page comprising a plurality of memory cells connected to one word-line, the data write portion comprising, in the write loop, a first operation mode of sequentially performing a program operation of recording data to a memory cell and a first verify operation of verifying data record in the memory cell, and a second operation mode of sequentially performing the program operation, the first verify operation, and a second verify operation of verifying data record in the memory cell, the data write portion comprising, in the first verify operation, precharging a bit-line connected to a predetermined first memory cell of the memory cells and a bit-line connected to a second memory cell in the same page as the first memory cell, the second memory cell being adjacent to the first memory cell, and sensing a current through the bit-line connected to the first memory cell to verify data of the first memory cell, then in the second verify operation, when the write to the second memory cell is completed, without precharging the bit-line connected to the second memory cell, precharging the bit-line connected to the first memory cell, and sensing a current through the bit-line connected to the first memory cell to verify data of the first memory cell, and the data write portion performing in the second operation mode in the write loop of the repeated write loops which the write loop may provide, in each data, most of the memory cells in which the data write is completed.

9. The non-volatile semiconductor memory device according to claim 8, wherein each memory cell stores N values per cell (N is an integer equal of two or more), the data write portion alternately repeats a first operation mode period of performing one or more continuous write loops in the first operation mode and a second operation mode period of performing one or more continuous write loops in the second operation mode, and in one data write, the second operation mode period appears in the range from one to N−1 times.

10. The non-volatile semiconductor memory device according to claim 8, wherein
each memory cell stores N values per cell (N is an integer of two or more), and
the data write portion applies, in the second verify operation of the write loop that may provide most of the memory cells in which the write of the n-th data (1<n<N) is completed, the verify pulse only necessary for the verify of the n-th data to the word-line.

11. The non-volatile semiconductor memory device according to claim 8, wherein
in a predetermined write loop performed in the second operation mode, the verify pulse necessary for the first verify operation is substantially the same as the verify pulse necessary for the second verify operation.

12. The non-volatile semiconductor memory device according to claim 8, wherein
each memory cell stores N values per cell (N is an integer of two or more),
the data write portion applies, in the first verify operation of the write loop that may provide the memory cells in which the write of the n-th data (1<n<N) is completed, the verify pulse only necessary for the verify of the n-th data to the word-line.

13. The non-volatile semiconductor memory device according to claim 8, wherein
in the change direction of the threshold voltage of the memory cell by the program operation, with a preliminary verify voltage being defined as a predetermined voltage lower than the desired threshold voltage corresponding to data to be written to the first memory cell,
the data write portion verifies, in a predetermined write loop, whether the threshold voltage of the first memory cell has reached the preliminary verify voltage, and according to the verify result, sets the program pulse necessary for the program operation in the next write loop.

14. The non-volatile semiconductor memory device according to claim 13, wherein
the increment between the program pulse used in a predetermined write loop and the program pulse used in a next write loop is a first increment for the threshold voltage of the first memory cell having not reached the preliminary verify voltage in the predetermined write loop, and the increment is a second increment for the threshold voltage of the first memory cell having reached the preliminary verify voltage in the predetermined write loop, and the second increment is smaller than the second increment.

15. A non-volatile semiconductor memory device comprising:
a memory cell array comprising a plurality of bit-lines, a plurality of word-lines intersecting the bit-lines, a source-line, and a plurality of NAND strings, each NAND string comprising a plurality of memory cells connected in series, each memory cell comprising a control gate connected to one of the word-lines, each NAND string comprising ends connected to the source-line and one of the bit-lines, respectively; and
a data write portion configured to repeat a write loop of writing data in units of a page comprising a plurality of memory cells connected to one word-line,
the data write portion comprising, in the write loop,
a first operation mode of sequentially performing a program operation of recording data to a memory cell and a first verify operation of verifying data record in the memory cell, and
a second operation mode of sequentially performing the program operation, the first verify operation, and a second verify operation of verifying data record in the memory cell,
the data write portion comprising,
in the first verify operation,
precharging a bit-line connected to a predetermined first memory cell of the memory cells and a bit-line connected to a second memory cell in the same page as the first memory cell, the second memory cell being adjacent to the first memory cell, and
sensing a current through the bit-line connected to the first memory cell to verify data of the first memory cell,
then in the second verify operation, when the write to the second memory cell is completed, without precharging the bit-line connected to the second memory cell,
precharging the bit-line connected to the first memory cell, and
sensing a current through the bit-line connected to the first memory cell to verify data of the first memory cell,
each memory cell storing N values (N is an integer equal of two or more),
the data write portion alternately repeating a first operation mode period of performing one or more continuous write loops in the first operation mode and a second operation mode period of performing one or more continuous write loops in the second operation mode, and
in one data write, the second operation mode period appearing in the range from one to N−1 times.

16. The non-volatile semiconductor memory device according to claim 15, wherein
each memory cell stores N values per cell (N is an integer of two or more), and
the data write portion applies, in the second verify operation of the write loop that may provide most of the memory cells in which the write of the n-th data (1<n<N) is completed, the verify pulse only necessary for the verify of the n-th data to the word-line.

17. The non-volatile semiconductor memory device according to claim 15, wherein
in a predetermined write loop performed in the second operation mode, the verify pulse necessary for the first verify operation is substantially the same as the verify pulse necessary for the second verify operation.

18. The non-volatile semiconductor memory device according to claim 15, wherein
each memory cell stores N values per cell (N is an integer of two or more),
the data write portion applies, in the first verify operation of the write loop that may provide the memory cells in which the write of the n-th data (1<n<N) is completed, the verify pulse only necessary for the verify of the n-th data to the word-line.

19. The non-volatile semiconductor memory device according to claim 15, wherein
in the change direction of the threshold voltage of the memory cell by the program operation, with a preliminary verify voltage being defined as a predetermined voltage lower than the desired threshold voltage corresponding to data to be written to the first memory cell,
the data write portion verifies, in a predetermined write loop, whether the threshold voltage of the first memory cell has reached the preliminary verify voltage, and according to the verify result, sets the program pulse necessary for the program operation in the next write loop.

20. The non-volatile semiconductor memory device according to claim 19, wherein the increment between the program pulse used in a predetermined write loop and the program pulse used in a next write loop is a first increment for the threshold voltage of the first memory cell having not reached the preliminary verify voltage in the predetermined write loop, and the increment is a second increment for the threshold voltage of the first memory cell having reached the preliminary verify voltage in the predetermined write loop, and the second increment is smaller than the second increment.

* * * * *